(12) United States Patent
Kang

(10) Patent No.: US 6,969,617 B2
(45) Date of Patent: Nov. 29, 2005

(54) METHOD FOR MANUFACTURING NAND TYPE NONVOLATILE FERROELECTRIC MEMORY CELL

(75) Inventor: Hee Bok Kang, Daejeon-si (KR)

(73) Assignee: Hyundai Electronics Industries Co., Ltd., Kyeonggi-Do (KR)

(*) Notice: Subject to any disclaimer, the term of this patent is extended or adjusted under 35 U.S.C. 154(b) by 0 days.

(21) Appl. No.: 11/070,304

(22) Filed: Mar. 3, 2005

(65) Prior Publication Data

US 2005/0141259 A1      Jun. 30, 2005

Related U.S. Application Data

(62) Division of application No. 10/747,944, filed on Dec. 31, 2003, now Pat. No. 6,900,064, which is a division of application No. 10/223,601, filed on Aug. 20, 2002, now Pat. No. 6,717,840, which is a division of application No. 09/433,358, filed on Nov. 4, 1999, now Pat. No. 6,459,118.

(30) Foreign Application Priority Data

Nov. 19, 1998  (KR)  ............................... 1998-49741

(51) Int. Cl.[7] .................. H01L 21/00; H01L 21/336
(52) U.S. Cl. .......................................... 438/3; 438/257
(58) Field of Search .................................. 438/3, 257

(56) References Cited

U.S. PATENT DOCUMENTS

| | | | |
|---|---|---|---|
| 4,873,664 A | 10/1989 | Eaton, Jr. | 365/145 |
| 5,300,799 A | 4/1994 | Nakamura et al. | 257/295 |
| 5,345,415 A | 9/1994 | Nakao et al. | 365/145 |
| 5,585,300 A | 12/1996 | Summerfelt | 437/60 |
| 5,680,344 A | 10/1997 | Seyyedy | 365/145 |
| 5,708,284 A | 1/1998 | Onishi | 257/295 |
| 5,903,492 A | 5/1999 | Takashima | 365/145 |

*Primary Examiner*—David S. Blum
(74) *Attorney, Agent, or Firm*—Fleshner & Kim, LLP

(57) ABSTRACT

NAND type non-volatile ferroelectric memory cell and non-volatile ferroelectric memory of the same, in which numbers of access to a main cell and a reference cell are made the same, to maintain bitline induced voltages by the reference cell and by the main cell constant, for improving operation characteristics, minimizing a layout area, and permits a high density device integration, the memory cell including an N number of transistors connected in series, a bitline having an input terminal of a first transistor and an output terminal of (N)th transistor among the N number of transistors connected thereto, wordlines respectively connected to gates of the transistors except the (N)th transistor, a WEC signal line connected to a gate of the (N)th transistor and adapted to have an enable signal applied thereto only in a write or re-store mode, and ferroelectric capacitors respectively connected both to the wordlines and output terminals of the transistors.

6 Claims, 32 Drawing Sheets

E : electric field
P : polarity

METHOD FOR MANUFACTURING NAND TYPE NONVOLATILE FERROELECTRIC MEMORY CELL

This application is a Divisional of application Ser. No. 10/747,944 filed on Dec. 31, 2003, now U.S. Pat. No. 6,900,064, which is a Divisional of application Ser. No. 10/223,601 filed Aug. 20, 2002, now U.S. Pat. No. 6,717,840, which is a Divisional of application Ser. No. 09/433,358 filed Nov. 4, 1999, now U.S. Pat. No. 6,459,118, and claims priority to Korean Patent Application No. 49741/1998 filed Nov. 19, 1998. The entire disclosure of the prior applications are considered as being part of the disclosure of the accompanying application and are hereby incorporated by reference therein.

BACKGROUND OF THE INVENTION

1. Field of the Invention

The present invention relates to a semiconductor memory, and more particularly, to an NAND type non-volatile ferroelectric memory cell and a non-volatile ferroelectric memory of the same.

2. Background of the Related Art

FIG. 1 illustrates a system of a related art NAND type DRAM.

Referring to FIG. 1, the NAND type DRAM cell is provided with a plurality of NMOS transistors T1, T2, T3, - - - connected in series, each having a gate connected to a wordline WL1, WL2, WL3, WL4, - - - . There is a bitline B/L formed in a direction crossing the wordlines, and there are ferroelectric capacitors C1, C2, C3, - - - each having one electrode connected to a drain terminal N1, N2, N3, - - - of the transistor and the other electrode connected to a plateline P/L, on which a constant voltage of ½ voltage is provided. Upon enabling the wordlines WL1, WL2, WL3, - - - in succession, NMOS transistors connected thereto are enabled, to provide data stored in the ferroelectric capacitors to the bitline. The data provided to the bitline is amplified at a sense amplifier (not shown), and re-stored in the ferroelectric capacitor.

The ferroelectric memory, i.e., an FRAM (Ferroelectric Random Access Memory), having in general a data processing speed similar to a DRAM (Dynamic Random Access Memory) used widely as a semiconductor memory and being capable of conserving data even if the power is turned off, is paid attention as a next generation memory. The FRAM, a memory having a structure similar to the DRAM, is provided with a capacitor of a ferroelectric material for utilizing a high residual polarization of the ferroelectric material. The residual polarization permits the conservation of a data even after removal of an electric field.

FIG. 2 illustrates a characteristic curve of a hysteresis loop of a general ferroelectric material.

Referring to FIG. 2, it can be known that a polarization induced by an electric field is, not erased, but, certain amount ('d' and 'a' states) of which is remained, even if the electric field is removed owing to existence of the residual polarization (or spontaneous polarization). The 'd' and 'a' states are corresponded to '1' and '0' respectively in application to memories.

A related art non-volatile ferroelectric memory will be explained with reference to the attached drawings. FIG. 3 illustrates a system of unit cell of the related art non-volatile ferroelectric memory.

Referring to FIG. 3, the system of unit cell of the related art non-volatile ferroelectric memory is provided with a bitline B/L formed in one direction, a wordline W/L formed in perpendicular to the bitline, a plateline P/L formed spaced from the wordline in a direction identical to the wordline, a transistor T1 having a gate connected to the wordline and a source connected to the bitline, and a ferroelectric capacitor FC1 having a first terminal connected to a drain of the transistor T1 and a second terminal connected to the plateline P/L.

A circuit for driving the related art ferroelectric memory will be explained. FIGS. 4A and 4B illustrate a circuit for driving the related art nonvolatile ferroelectric memory.

The circuit for driving the related art ferroelectric memory of an 1T/1C (one transistor and one ferroelectric capacitor) structure is provided with a reference voltage generator 1 for generating a reference voltage, a reference voltage stabilizer 2 having a plurality of transistors Q1~Q4 and a capacitor C1 for stabilizing reference voltages on adjacent two bitlines, a first reference voltage storage 3 having a plurality of transistors Q6~Q7, and capacitors C2~C3 for respectively having logical values of "1" and "0" stored in adjacent bitlines, a first equalizer 4 having a transistor Q5 for equalizing adjacent two bitlines, a first main cell array 5 connected to wordlines and platelines different from each other for storing data, a first sense amplifier 6 having a plurality of transistors Q10~Q15, a P-sense amplifier PSA and the like for sensing data in cells selected by the wordline among the plurality of cells in the first main cell array 5, a second main cell array 7 connected to wordlines and platelines different from one another for storage of data, a second reference voltage storage 8 having a plurality of transistors Q28~Q29 and capacitors C9~C10 for having reference voltages with logical values of "1" and "0" stored in adjacent bitlines, and a second sense amplifier 9 having a plurality of transistors Q16~Q25, N-sense amplifier NSA and the like for sensing and forwarding a data in the second main array 7.

The data input/output operation of the related art ferroelectric memory will be explained. FIG. 5 illustrates a timing diagram of a write mode operation of the related art ferroelectric memory, and FIG. 6 illustrates a timing diagram of a read mode operation of the related art ferroelectric memory.

In writing, when an external chip enable signal CSB pad is enabled from 'high' to 'low' and a write enable signal WEBpad is applied from 'high' to 'low' on the same time, the write mode is started. When address decoding is started in the write mode, a pulse applied to a pertinent wordline is transited from 'low' to 'high' to select a cell. Thus, during a period the wordline is held 'high', a pertinent plateline has a 'high' signal applied thereto for one period and a 'low' signal applied thereto for the other period in succession. And, in order to write a logical value '1' or '0' on the selected cell, a 'high' or 'low' signal synchronized to the write enable signal WEBpad is applied to a pertinent bitline. That is, if a 'high' signal is applied to the bitline and a signal applied to the plateline is 'low' in a period in which a signal applied to the wordline is 'high', a logical value '1' is written on the ferroelectric capacitor. And, if a 'low' signal is applied to the bitline and a signal applied to the plateline is 'high', a logical value '0' is written on the ferroelectric capacitor.

The operation for reading the data stored in the cell by the aforementioned write mode operation will be explained.

If the chip enable signal CSBpad is enabled from 'high' to 'low' externally, all bitlines are equalized to a 'low' voltage before a pertinent wordline is selected. That is, referring to FIGS. 3A and 3B, if a 'high' signal is applied to the equalizer 4 and a 'high' signal is applied to the transistors Q18 and Q19, as the bitlines are grounded through the transistor Q19, the bitlines are equalized to a low voltage Vss. And, the transistors Q5, Q18, and Q19 are turned off, to disable the bitlines, an address is decoded, and the decoded address causes a 'low' signal on a pertinent wordline to transit to a 'high' signal, to select a pertinent cell. A 'high' signal is applied to the plateline of the selected cell, to break a data corresponding to a logical value '1' stored in the ferroelectric memory. If a logical value '0' is in storage in the ferroelectric memory, a data corresponding to the logical value '0' is not broken. The data not broken and the data broken provide values different from each other according to the aforementioned hysteresis loop, so that the sense amplifier senses a logical value '1' or '0'. The case of the data broken is a case when the value is changed from 'd' to 'f' in the hysteresis loop of FIG. 2, and the case of the data not broken is a case when the value is changed from 'a' to 'f' in the hysteresis loop of FIG. 2. Therefore, if the sense amplifier is enabled after a certain time period is passed, in the case of the data broken, a logical value '1' is provided as amplified, and in the case of the data not broken, a logical value '0' is provided. After the sense amplifier provides data thus, since an original data should be restored, the plateline is disabled from 'high' to 'low' in a state a 'high' signal is applied to a pertinent wordline.

The aforementioned related art ferroelectric memory has the following problem.

The frequent use of one reference cell required for reading main cells a few hundred times more than the main cells under a state the ferroelectric properties are not assured perfectly, that requires the reference cell much more operation than the main cells, causes a rapid degradation of the reference cell, resulting in a voltage instability, device operation characteristics deterioration, and short lifetime.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Accordingly, the present invention is directed to an NAND type non-volatile ferroelectric memory cell and a non-volatile ferroelectric memory of the same that substantially obviates one or more of the problems due to limitations and disadvantages of the related art.

An object of the present invention is to provide an NAND type non-volatile ferroelectric memory cell and a non-volatile ferroelectric memory of the same, in which numbers of access to a main cell and a reference cell are made the same, to maintain bitline induced voltages by the reference cell and by the main cell constant, for improving operation characteristics, minimizing a layout area, and permits a high density device integration.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the NAND type non-volatile ferroelectric memory cell includes an N number of transistors connected in series, a bitline having an input terminal of a first transistor and an output terminal of (N)th transistor among the N number of transistors connected thereto, wordlines respectively connected to gates of the transistors except the (N)th transistor, a WEC signal line connected to a gate of the (N)th transistor and adapted to have an enable signal applied thereto only in a write or re-store mode, and ferroelectric capacitors respectively connected both to the wordlines and output terminals of the transistors.

In other aspect of the present invention, there is provided an NAND type non-volatile ferroelectric memory including a global X decoder for controlling a plurality of global wordlines, an N number of transistors connected in series, a bitline having a source of a first transistor and a drain of (N)th transistor among the N number of transistors connected thereto, a WEC signal line connected to a gate of the (N)th transistor, wordlines respectively connected to gates of the transistors except the (N)th transistor, a cell array having a plurality of NAND type non-volatile ferroelectric memory cells each having a ferroelectric capacitor connected between a drain of one of the transistors except the (N)th transistor and one of the wordlines, a bitline controller disposed under the cell array for temporary storage of a data read from any cell selected from the cell array, and forwarding the data in writing and re-storing, a local X decoder for providing an enable signal for enabling the wordlines and the WEC signal, and a wordline driver for applying the wordline enable signal from the local X decoder to the transistors in sequence starting from the first transistor, and applying the WEC signal only in a write mode.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
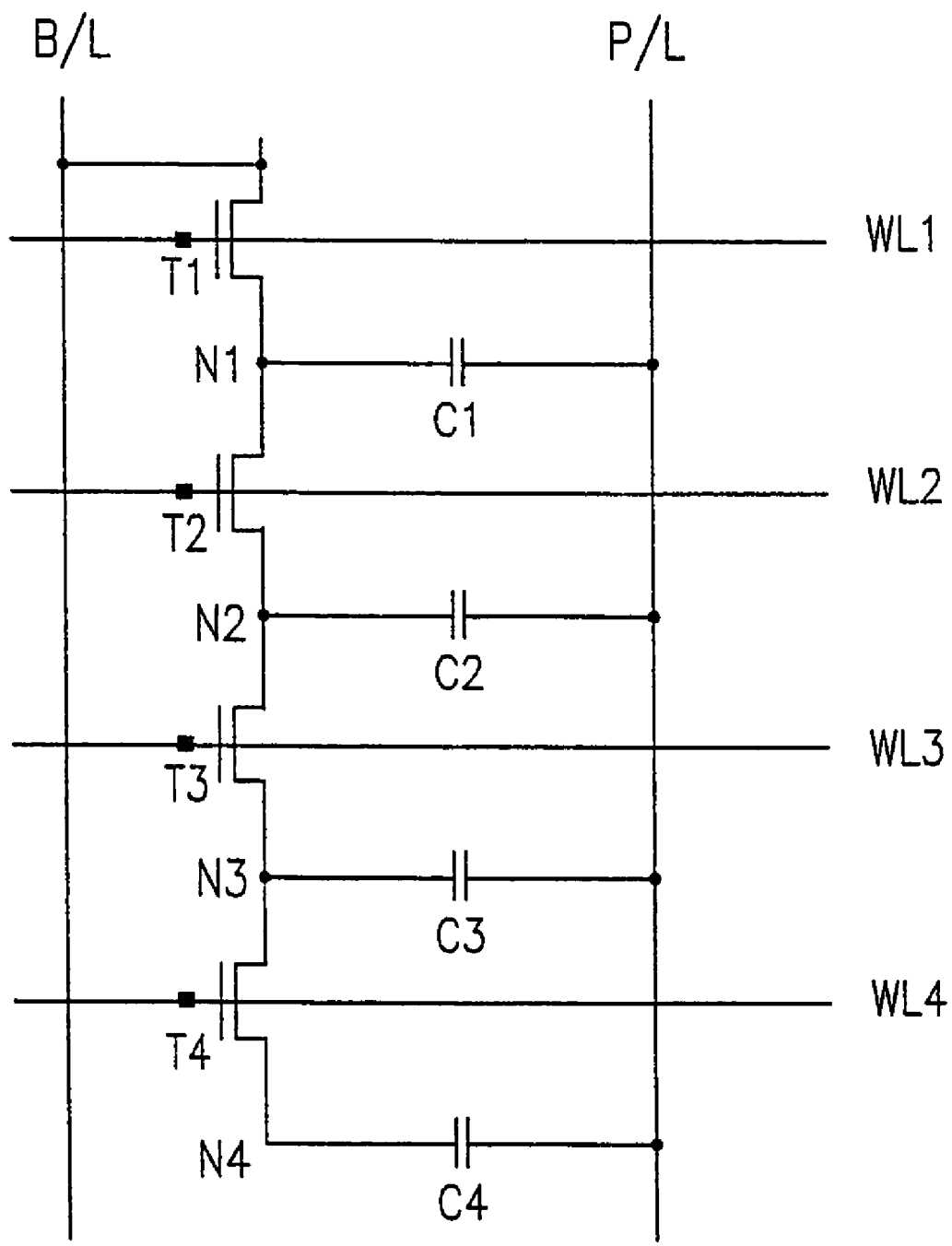
FIG. 1 illustrates a system of a related art NAND type DRAM.
Figure 2:
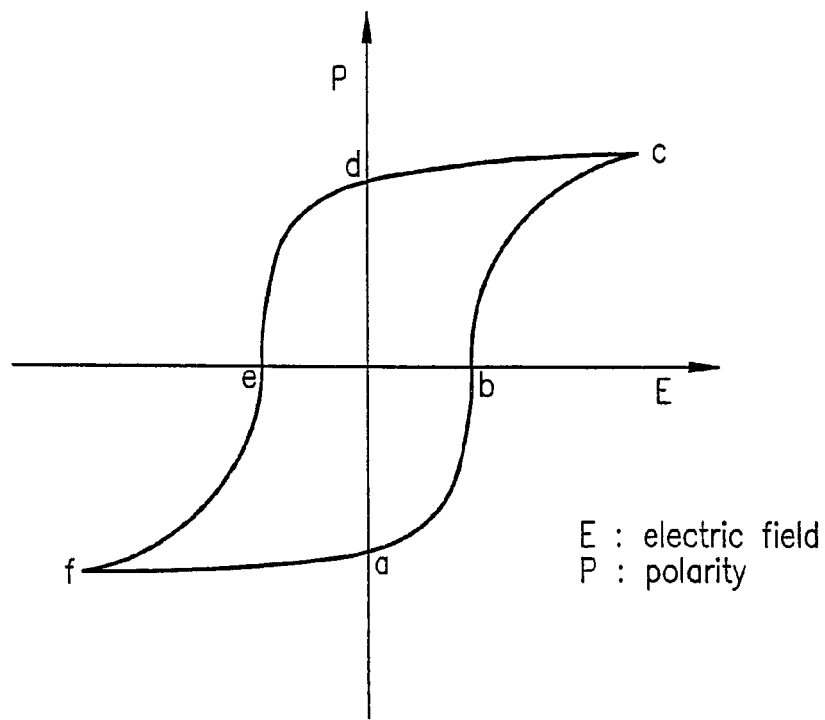
FIG. 2 illustrates a characteristic curve of a hysteresis loop of a general ferroelectric material.
Figure 3:
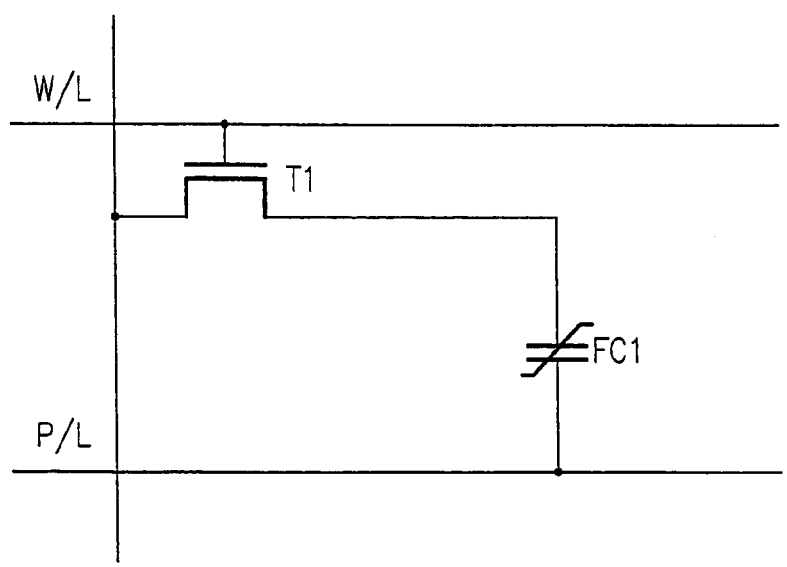
FIG. 3 illustrates a system of unit cell of the related art non-volatile ferroelectric memory.
Figure 4A:
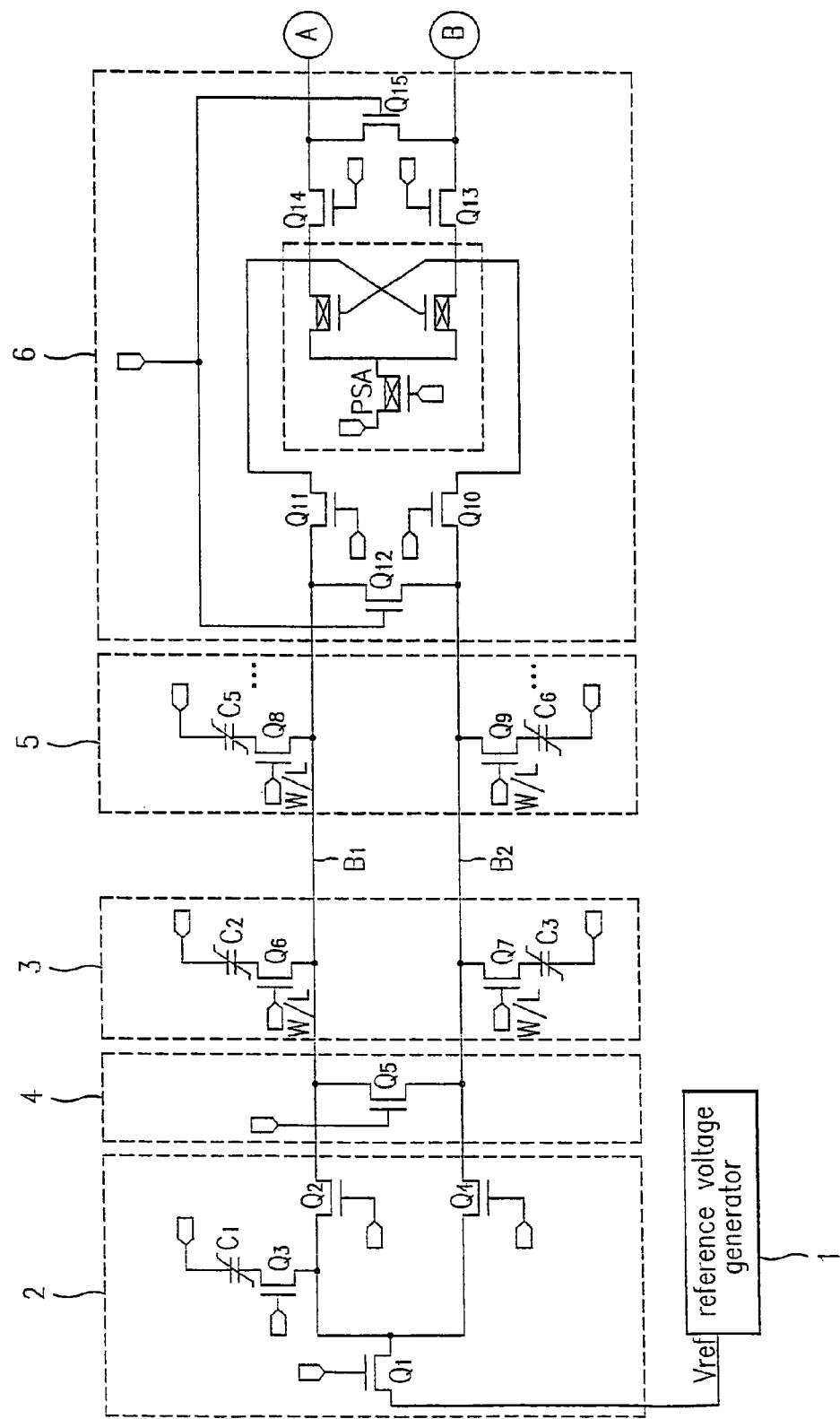
FIGS. 4A and 4B illustrate a circuit for driving the related art nonvolatile ferroelectric memory.
Figure 4B:
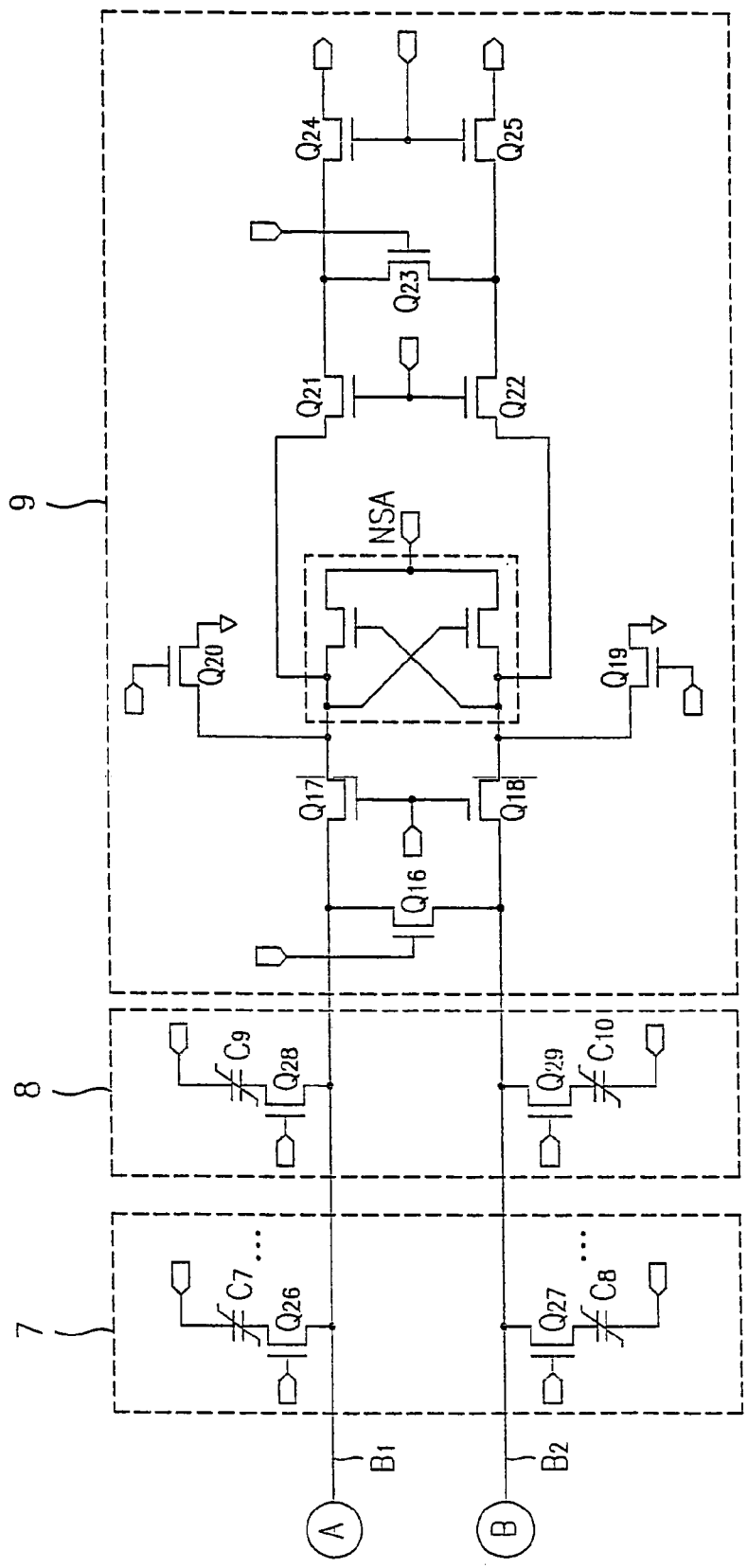
Figure 5:
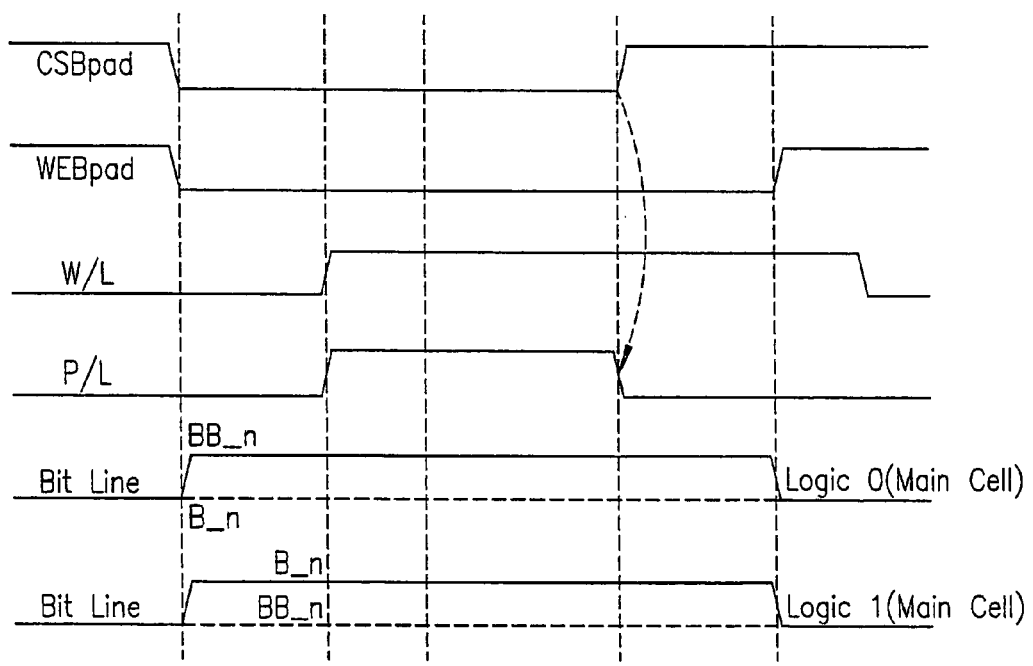
FIG. 5 illustrates a timing diagram of a write mode operation of the related art ferroelectric memory.
Figure 6:
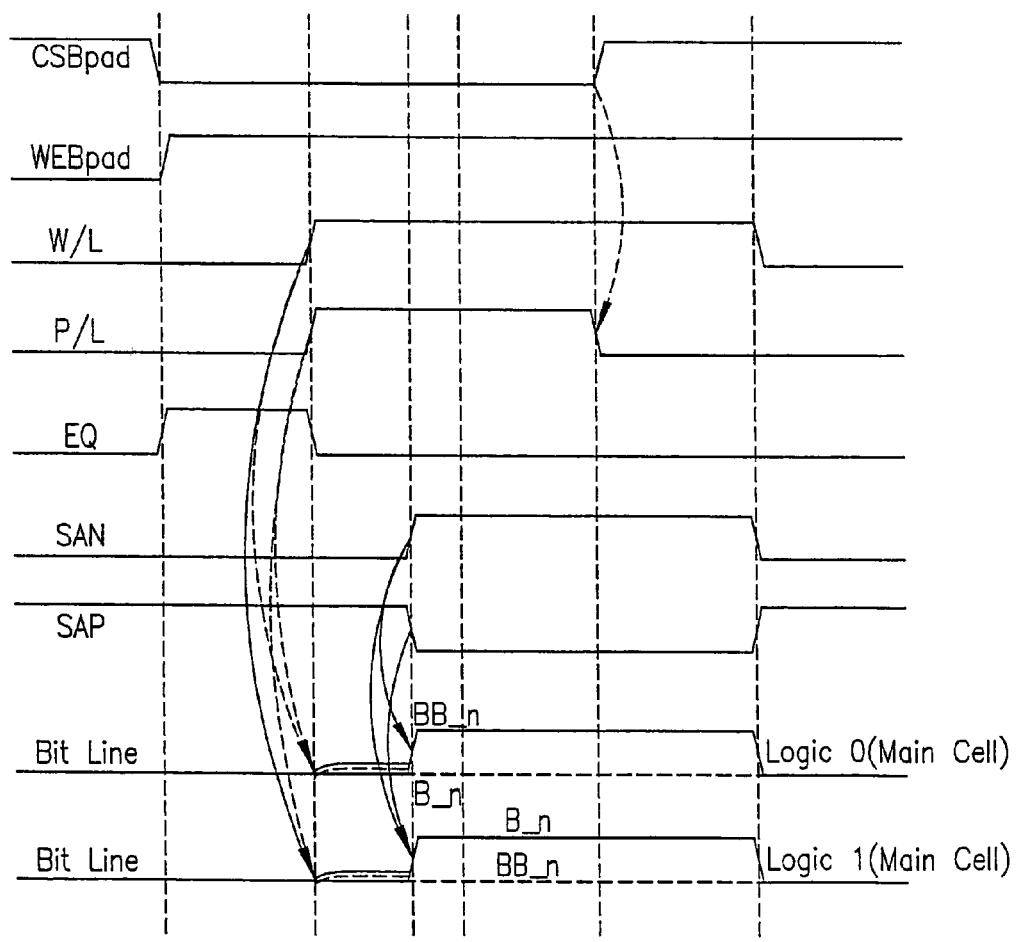
FIG. 6 illustrates a timing diagram of a read mode operation of the related art ferroelectric memory.
Figure 7A:
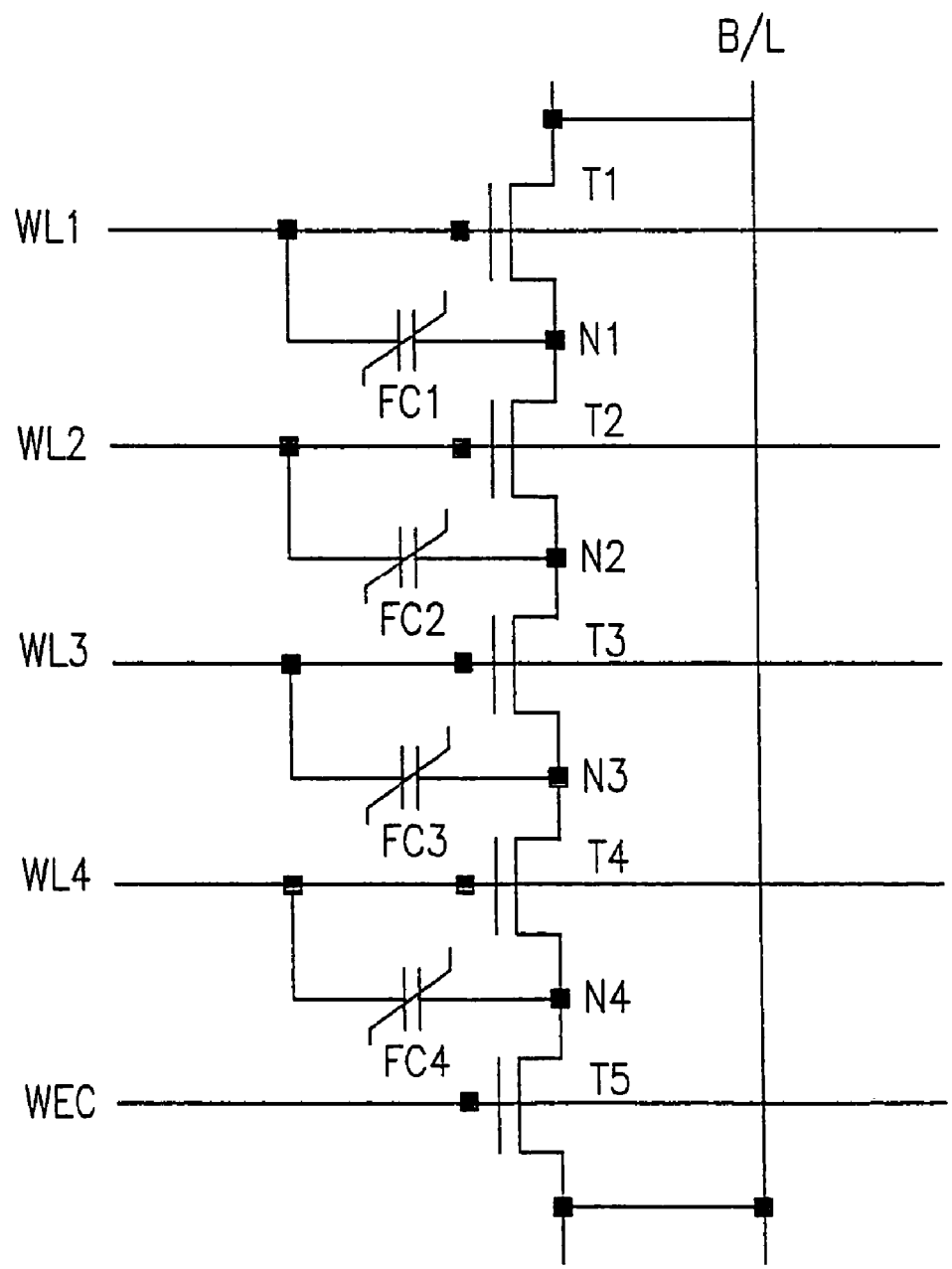
FIG. 7A illustrates a unit cell of an NAND type nonvolatile ferroelectric memory cell in accordance with a preferred embodiment of the present invention.

Reference will now be made in detail to the preferred embodiments of the present invention, examples of which are illustrated in the accompanying drawings. FIG. 7A illustrates a unit cell of an NAND type nonvolatile ferroelectric memory cell in accordance with a preferred embodiment of the present invention.

Referring to FIG. 7A, the unit cell is provided with NMOS transistors T1, T2, - - - T5 connected in series, and a bitline B/L formed in a direction the transistors are formed. A source of the first transistor T1 and a drain of the last transistor T5 are connected to the bitline B/L. A gate of each transistor is connected to a wordline, and a gate of the last transistor T5 is connected to a WEC signal line. The WEC signal is held disabled in a read mode and enabled only in a write mode. Ferroelectric capacitors FC1, FC2, FC3, FC4 are connected to the wordlines which are connected to gates of the transistors and drains of the transistors, but the last transistor T5 has no ferroelectric capacitor. A plurality of the system of FIG. 7A is provided, to form a volatile ferroelectric memory cell array. Though, the unit cell in FIG. 7A is an 4-NAND type, the unit cell may be 2-NAND, 3-NAND, n-NAND. The present invention will be explained taking a 4-NAND type nonvolatile ferroelectric memory cell as an example.

Figure 7B:
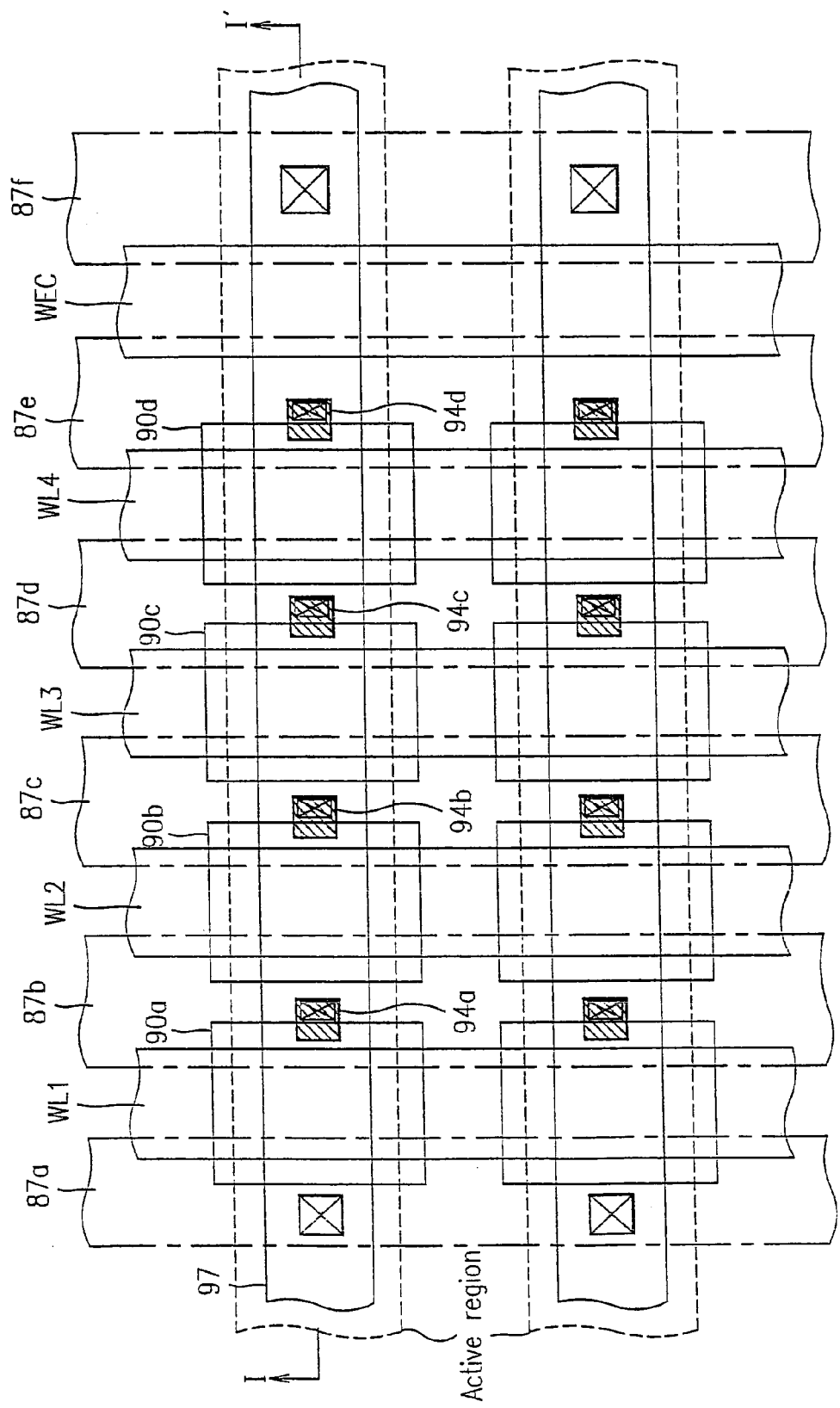
FIG. 7B illustrates a layout of the unit cell in FIG. 7A.

FIG. 7B illustrates a layout of the unit cell in FIG. 7A.

Referring to FIG. 7B, the layout of the unit cell includes wordlines WL1~WL4 and a WEC electrode WEC form at fixed intervals in one direction, a capacitor first electrode (not shown) formed over each wordline with a barrier metal disposed inbetween, and a capacitor second electrode 90a~90d over the capacitor first electrode with a ferroelectric film (not shown) disposed inbetween. And, there are impurity regions on both sides of the wordline, and plugs 94a~94d for connecting impurity regions 87b, 87c, 87d and 87e on one side of the capacitor second electrodes 90a~90d and the capacitor second electrodes 90a~90d, and bitlines 97 electrically connected to the impurity regions on opposite sides 87a and 87f formed in a direction crossing the wordlines along an active region. Though not shown in the drawing, a gate insulating film insulates the wordlines from the semiconductor substrate.

Figure 7C:
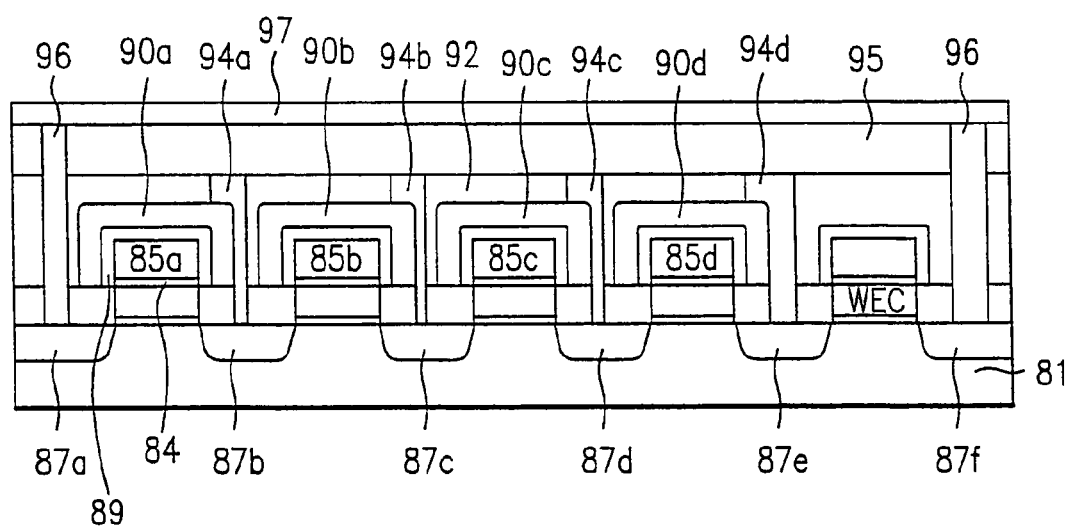
FIG. 7C illustrates a section across line I–I' in FIG. 7B.

In the meantime, FIG. 7C illustrates a section across line I–I' in FIG. 7B, including a first conduction type semiconductor substrate 81, N number of source and drain regions 87a~87f formed at fixed intervals in a surface of the semiconductor substrate 81, wordlines WL1~WL4 and WED electrode formed over the substrate between the source and drain regions, ferroelectric capacitor first electrodes 85a~85d formed over the wordlines WL1~WL4 disposed with barrier metals 84 inbetween, ferroelectric films 89 on sides and top of the first electrodes, ferroelectric capacitor second electrodes 90a~90d formed on the ferroelectric films, plugs 94a~94d for connecting source and drain regions 87b, 87c, 87d and 87e of the N source and drain regions 87a~87f excluding the first region 87a and the (N)th region 87f to the second electrodes 90a~90d adjacent to the source and drain regions 87b, 87c, 87d and 87e excluding the first region 87a and the (N)th region 87f, and bitlines 96 formed on the substrate inclusive of the plugs with an insulating film 95 disposed inbetween and electrically connected to the first region 87a and (N)th region 87f.

The steps of a method for fabricating the aforementioned NAND type nonvolatile ferroelectric memory cell in accordance with a first preferred embodiment of the present invention will be explained with reference to FIGS. 8A~8G. FIGS. 8A~8G illustrate sections showing the steps of a method for fabricating an NAND type nonvolatile ferroelectric memory cell in accordance with a first preferred embodiment of the present invention.

Figure 8A:
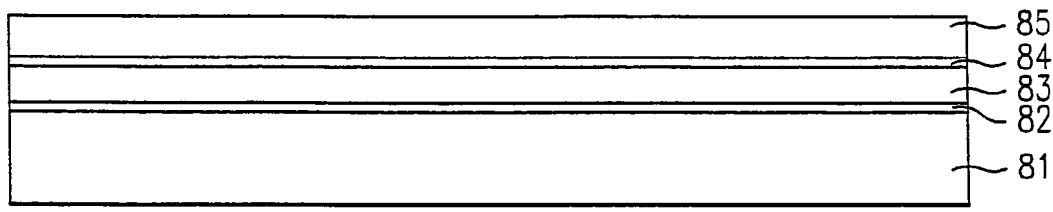
FIGS. 8A~8G illustrate sections showing the steps of a method for fabricating an NAND type nonvolatile ferroelectric memory cell in accordance with a first preferred embodiment of the present invention.
Figure 8B:
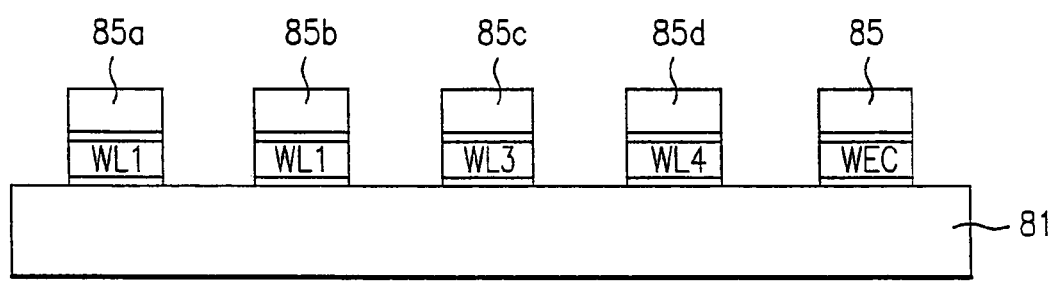
Figure 8C:
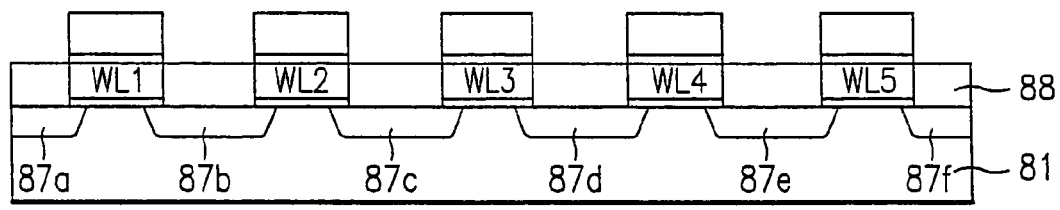
Figure 8D:
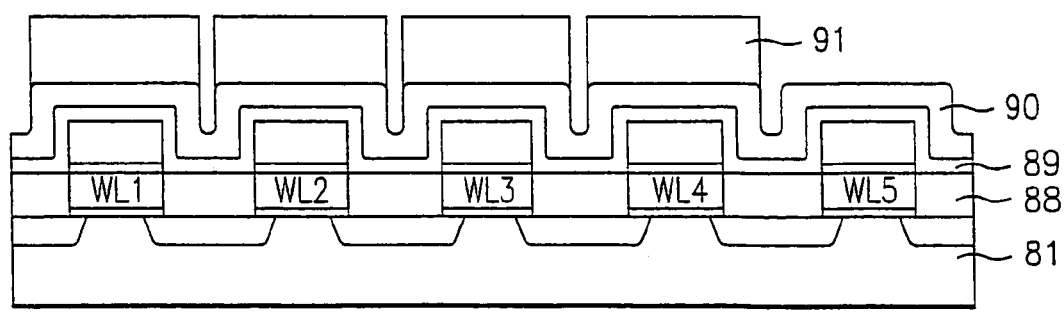
Figure 8E:
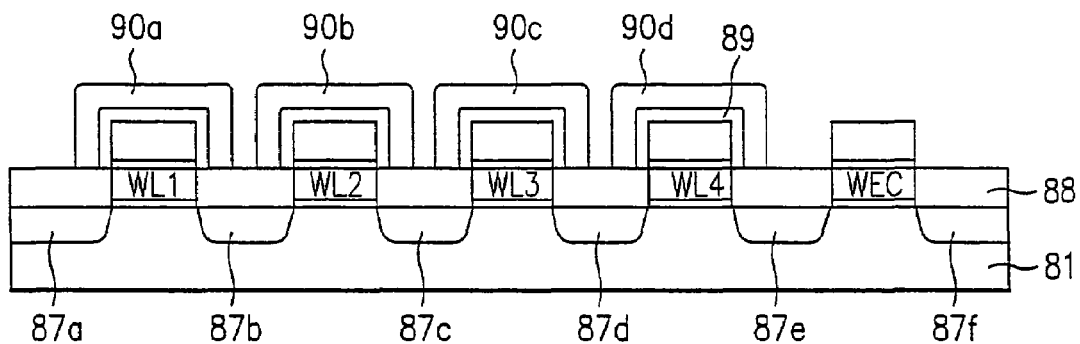
Figure 8F:
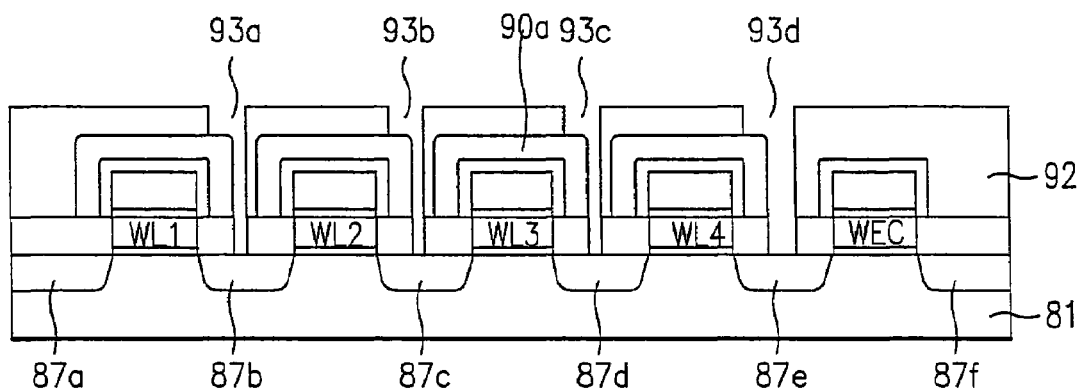
Figure 8G:
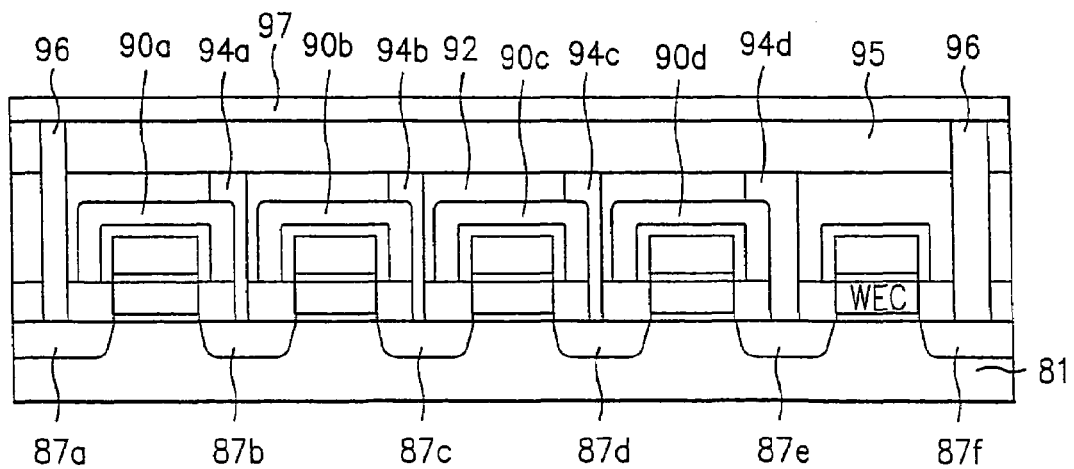

Referring to FIG. 8A, a first conduction type semiconductor substrate is defined into an active region and a field region, and a gate insulating film 82 is formed on the active region of the semiconductor substrate 81. Polysilicon 83 is deposited on the gate insulating film 82, and a barrier metal layer 84 is formed on the polysilicon layer 83. And, capacitor electrode materials 85 are formed on the barrier metal layer 84 in succession. Photoresist (not shown) is coated on the capacitor electrode material 85, and subjected to patterning by exposure and development. The patterned photoresist is used as a mask in selectively etching and removing the capacitor electrode material 85, the barrier metal 84, the polysilicon layer 83 and the gate insulating film 82, to form, as shown in FIG. 8B, wordlines WL1~WL4 and capacitor first electrodes 85a~85d at fixed intervals. In this instance, a WEC electrode WEC is also formed when the wordlines are formed, and though the capacitor electrode material 85 is also formed on the WEC electrode, the WEC electrode is not used as an electrode. As shown in FIG. 8C, the wordlines WL1~WL4 and WEC electrode are used as masks in ion implanting and annealing, to form second conduction type impurity regions 87a, 87b, 87c, 87d, 87e and 87f in the wordlines WL1~WL4 and in the substrate 81 on both sides of the WEC electrode. Then, an insulating film 88 is deposited on the substrate 81 inclusive of the capacitor first electrodes 85a~85d, and etched back until sides of the barrier metal 84 is exposed. Then, as shown in FIG. 8D, a ferroelectric film 89 is formed on the insulating film 88 inclusive of the wordlines and the WEC electrode, and a capacitor electrode material 90 is formed on the ferroelectric film 89. Photoresist 91 is coated on the capacitor electrode material 90, and subjected to patterning by exposure and development. The patterned photoresist mask is used as a mask in selectively etching and removing the capacitor electrode material 90 and the ferroelectric film 89, to form, as shown in FIG. 8E, capacitor second electrodes 90a, 90b, 90c and 90d. In this instance, the ferroelectric film and the capacitor upper electrode formed on the WEC electrode are removed. As shown in FIG. 8F, an insulating film 92 is deposited on an entire surface of the substrate 81 inclusive of the capacitor upper electrode 90a. The insulating film 92 is selectively removed, to expose the second conduction type impurity regions 87b, 87c, 87d and 87e between the wordlines and a portion of the capacitor second electrode 90, to form contact holes 93a~93d. As shown in FIG. 8G, a conductive material is deposited on the insulating film 92 inclusive of the contact holes 93a~93d, and etched back to form plugs 94 for electrically connecting the second conductive material layers 87b, 87c, 87d and 87e and the capacitor upper electrodes 90a. An insulating film 95 is deposited on the insulating film 92 again inclusive of the plugs 94. Contact holes are formed to expose the second conduction type impurity regions 87a and 87f formed on one side of the first wordline WL1 and on one side of the WEC electrode. Thereafter, upon stuffing the contact holes with the conductive material 96, and forming bitlines 97 electrically connected to the conductive material 96, the process for fabricating an 4-NAND type nonvolatile ferroelectric memory cell of the present invention is completed. As the 4-NAND type nonvolatile ferroelectric memory cell in accordance with a first preferred embodiment of the present invention has the ferroelectric film extended to sides inclusive of a top surface of the first electrode, the capacitance can be increased as much.

FIGS. 9A~9G illustrate sections showing the steps of a method for fabricating an NAND type nonvolatile ferroelectric memory cell in accordance with a second preferred embodiment of the present invention. A circuitry system of the nonvolatile ferroelectric memory cell in the method for fabricating a nonvolatile memory cell in accordance with a second embodiment of the present invention is the same with the first embodiment of the present invention.

Figure 9A:
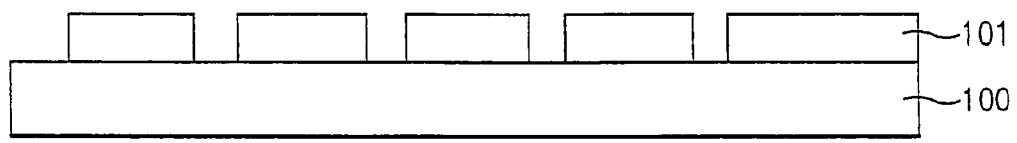
FIGS. 9A~9F illustrate sections showing the steps of a method for fabricating an NAND type nonvolatile ferroelectric memory cell in accordance with a second preferred embodiment of the present invention.
Figure 9B:
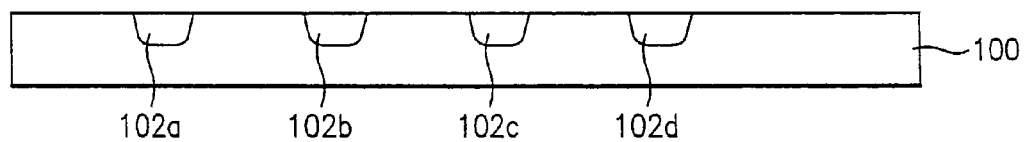
Figure 9C:
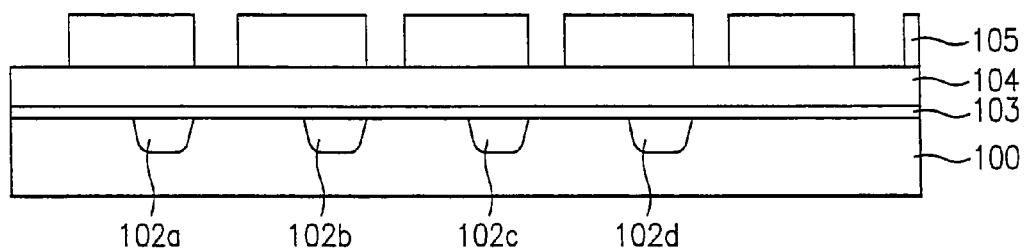
Figure 9D:
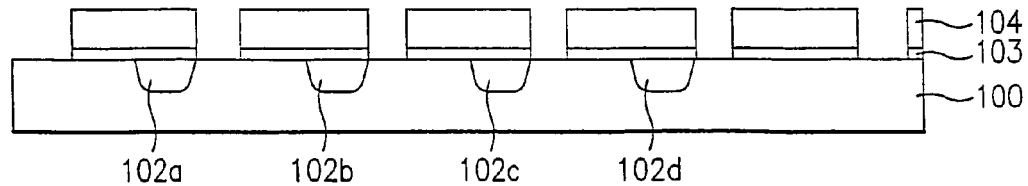
Figure 9E:
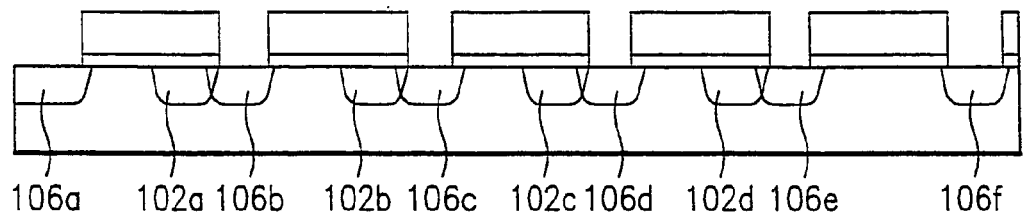
Figure 9F:
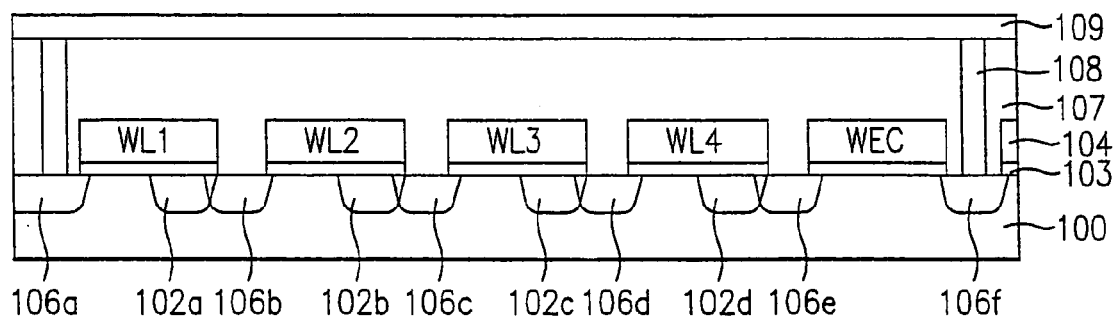

Referring to FIG. 9A, photoresist is coated on the active region of the semiconductor substrate 100, and subjected to patterning by exposure and development to form first photoresist patterns 101 at fixed intervals. The first photoresist patterns 101 are used as masks in implanting $N^+$ ions into the semiconductor substrate 100, and subjecting to annealing, to form, as shown in FIG. 9B, first $N^+$ impurity regions 102a, 102b, 102c and 102d at fixed intervals, which are to be used as capacitor first electrodes. Then, as shown in FIG. 9C, a ferroelectric film 103 is formed on the semiconductor substrate 100 having the first $N^+$ impurity regions 102a~102d formed therein selectively. A metal layer 104 is formed on the ferroelectric film 103. A photoresist is coated on the metal layer 104, and subjected to patterning, to form second photoresist patterns 105 on the metal layer 104 over the first $N^+$ type impurity regions 102a~102d. In this instance, after formation of the ferroelectric film 103, a process for forming a diffusion barrier (not shown) may be conducted additionally for prevention of diffusion of the ferroelectric film 103 into a capacitor second electrode to be formed later. As shown in FIG. 9D, the second photoresist pattern 105 are used as masks in etching the metal layer 104 and the ferroelectric film 103 selectively, to expose the substrate 100. In this instance, the second photoresist patterns 105 are formed, such that the exposed portion of the substrate 100 is aligned to one side of the first $N^+$ impurity regions 102a~102d. The metal layer 104 is used, not only as the wordlines and the capacitor second electrodes, but also as the WEC electrode. Then, as shown in FIG. 9E, the metal layer is used as a mask in implanting $N^+$ ions again heavily and conducting annealing, to form second $N^+$ impurity regions 106a~106f at sides of the first $N^+$ impurity regions 102a~102d. As shown in FIG. 9F, an insulating layer 107 is formed on an entire surface of the substrate 100 inclusive of the metal layer 104, and subjected to selective etching to expose impurity regions 106a and 106f at opposite sides of the substrate 100 among the second $N^+$ impurity regions 106a~106f, to form bitline contacts 108. Thereafter, upon formation of bitlines 109 on the insulating layer inclusive of the bitline contacts 108, the process for fabrication of an NAND type nonvolatile ferroelectric memory cell in accordance with a second preferred embodiment of the present invention is completed. Thus, the method for fabrication of an NAND type nonvolatile ferroelectric memory cell in accordance with a second preferred embodiment of the present invention employs the first $N^+$ impurity regions 102a~102d formed in the substrate 100 and the wordlines as ferroelectric capacitor first and second electrodes, permitting to simplify the fabrication process.

Figure 9G:
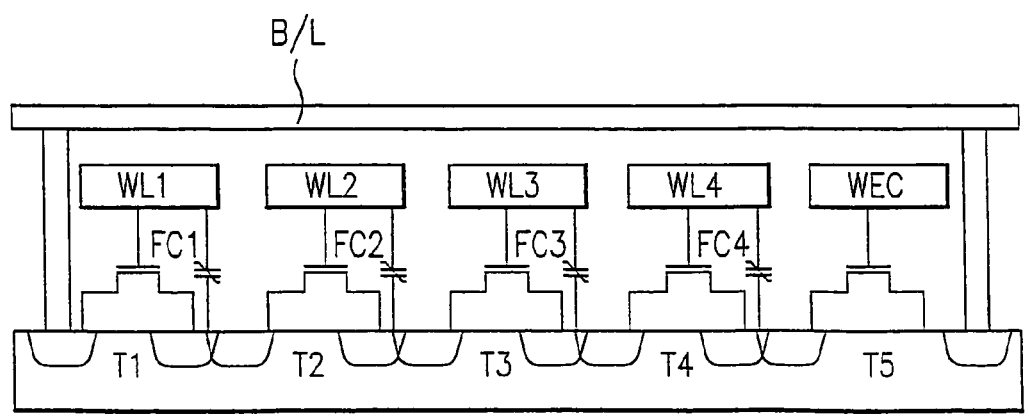
FIG. 9G illustrates a section equivalent to FIG. 9F.

FIG. 9G illustrates a section equivalent to FIG. 9F.

Figure 10:
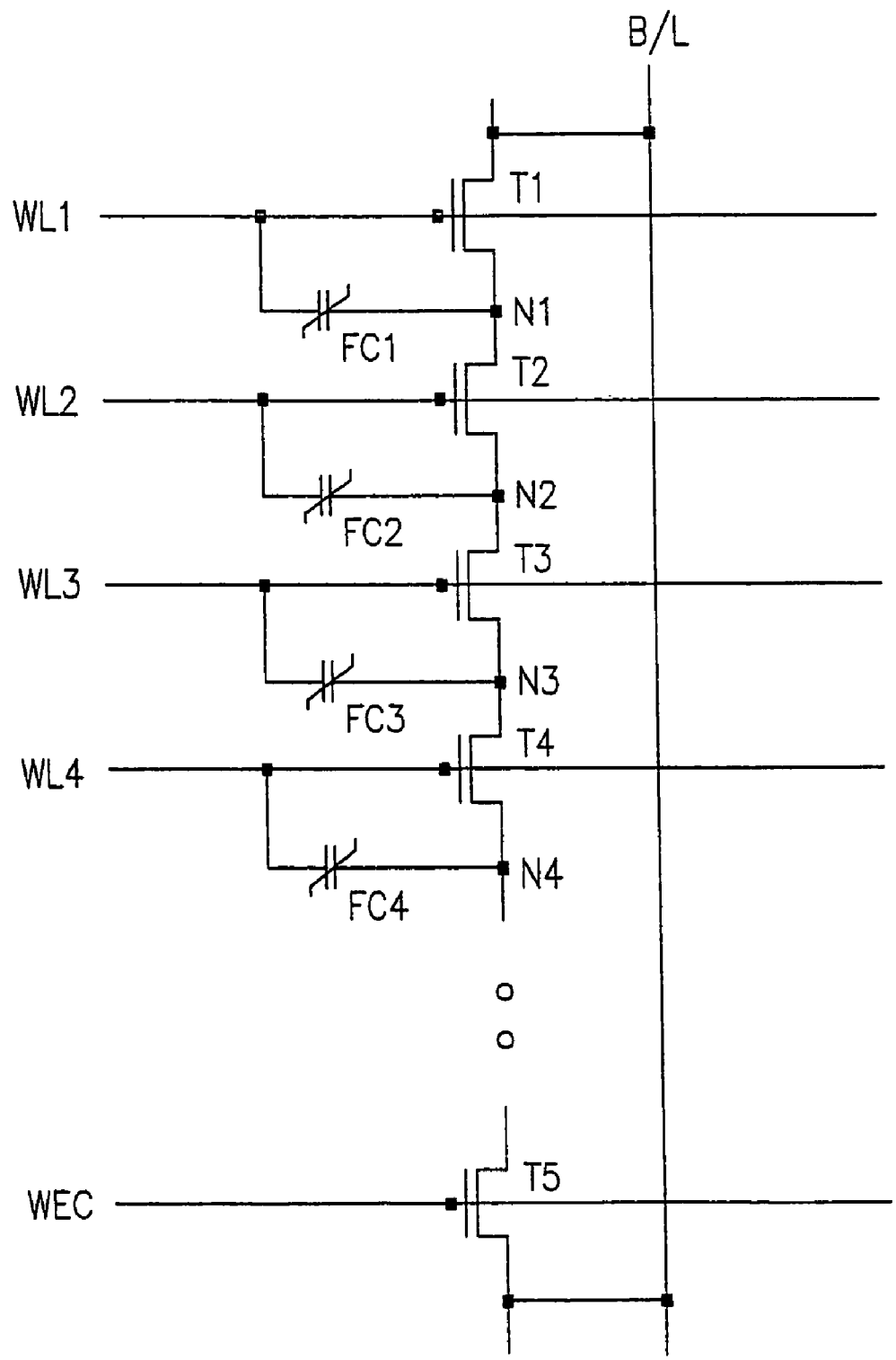
FIG. 10 illustrates a system of a multi-NAND type basic cell in accordance with the present invention.

FIG. 10 illustrates a system of a multi-NAND type basic cell in accordance with the present invention, including a plurality of wordlines WL1, WL2, WL3, WL4, - - - , $WL_N$, and a plurality of NMOS transistors T1, T2, T3, T4, - - - , $T_N$, wherein a source of the first NMOS transistor T1 and a drain of the last NMOS transistor are connected to bitlines.

Figure 11:
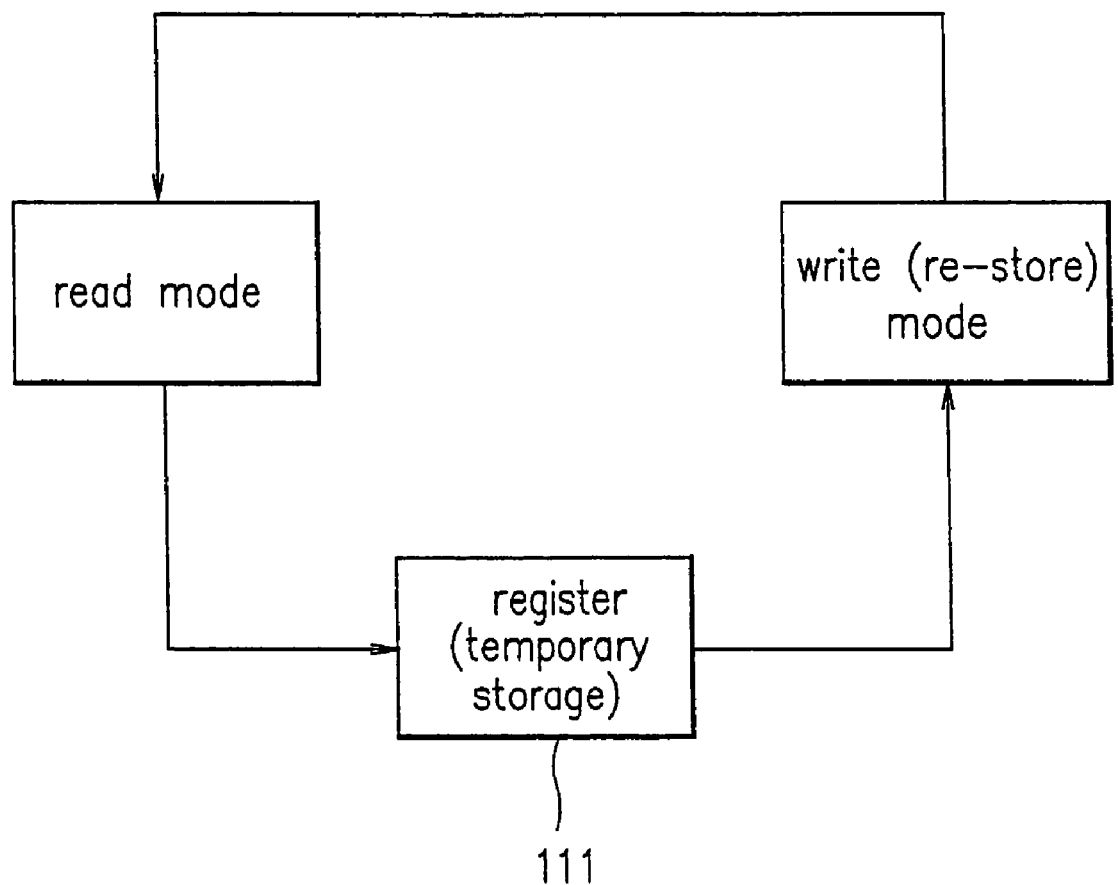
FIG. 11 illustrates a block diagram for explaining a basic operation mechanism of an NAND nonvolatile ferroelectric memory cell of the present invention.

FIG. 11 illustrates a block diagram for explaining a basic operation mechanism of an NAND nonvolatile ferroelectric memory cell of the present invention.

Referring to FIG. 11, in a read mode, data stored in each ferroelectric capacitor is read and stored one by one in a register 111 which is a temporary storage. Upon finishing data reading from the memory cells, data in storage in the register 111 temporarily are written on respective ferroelectric capacitors again, to finish the operation. The register 111 may be a sense amplifier or an SRAM.

Figure 12:
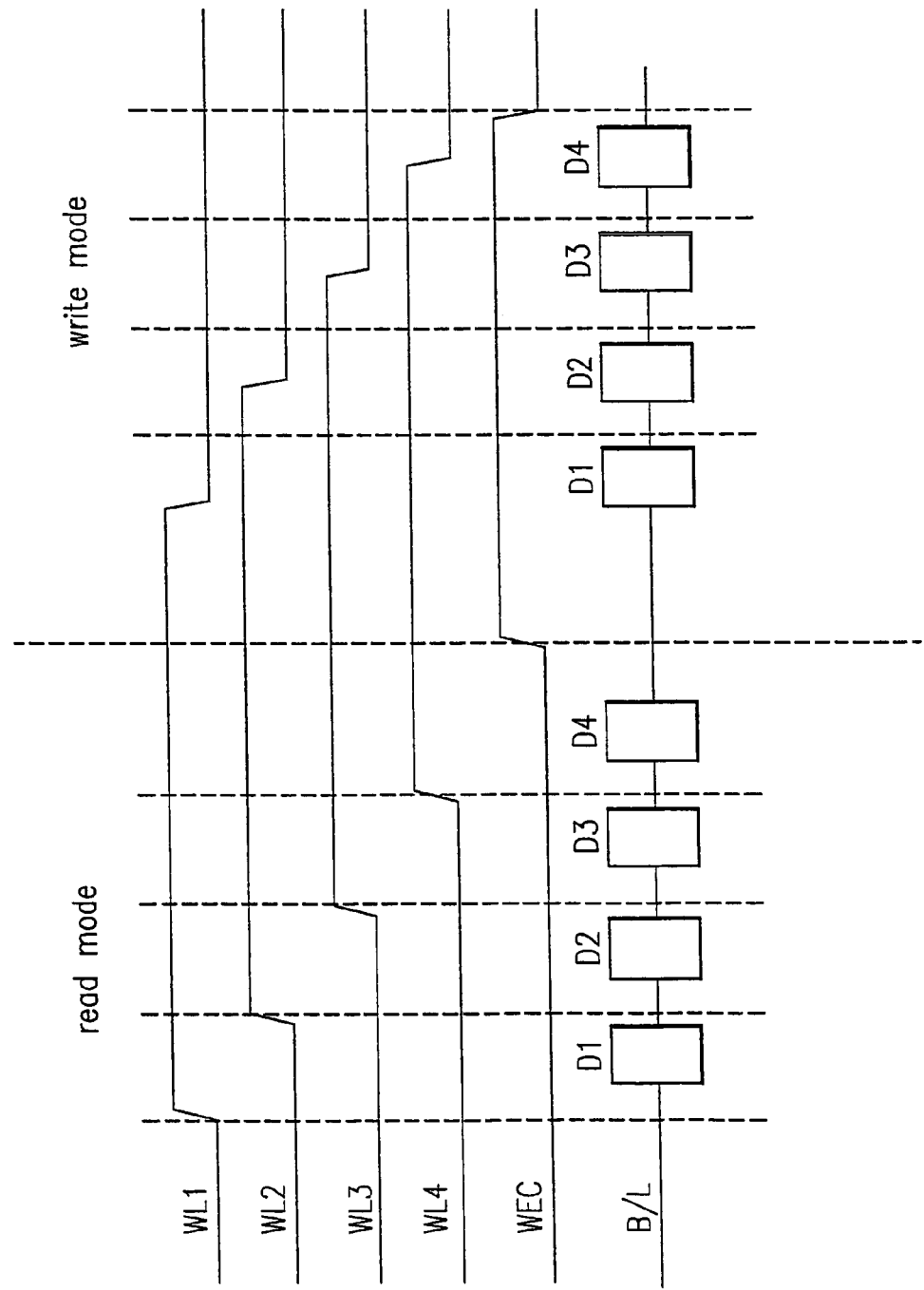
FIG. 12 illustrates a timing diagram of an operation mechanism the same as FIG. 10 in a read and a write modes.

FIG. 12 illustrates a timing diagram of an operation mechanism the same as FIG. 10 in a read and a write modes of an 4-NAND type nonvolatile ferroelectric memory cell.

Referring to FIG. 12, in a read mode, by enabling the wordlines WL1, WL2, WL3 and WL4 in succession, the data D1, D2, D3 and D4 stored in respective ferroelectric capacitors are read through the bitlines in succession and stored in the register, which is a temporary storage. The WEC signal is transited to a low level to disenable an NMOS transistor T5. Then, provided that all the data stored in the ferroelectric capacitors FC1, FC2, FC3 and FC4 are read, the WEC signal is transited to a high level in a write or re-store mode, to enable the NMOS transistor T5. After the wordlines WL1, WL2, WL3 and WL4 are disenabled in succession, the WEC signal is disenabled to a low level too, to complete writing the data stored in the register 111 temporarily on respective ferroelectric capacitors, again.

Figure 13A:
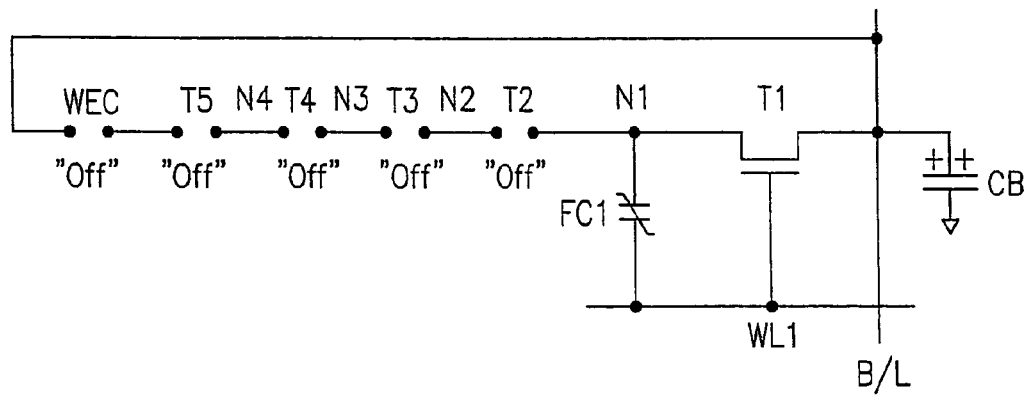
FIGS. 13A and 13B explain basical read/write operation mechanisms for processing a logic "1" on a ferroelectric capacitor of the present invention, respectively.
Figure 13B:
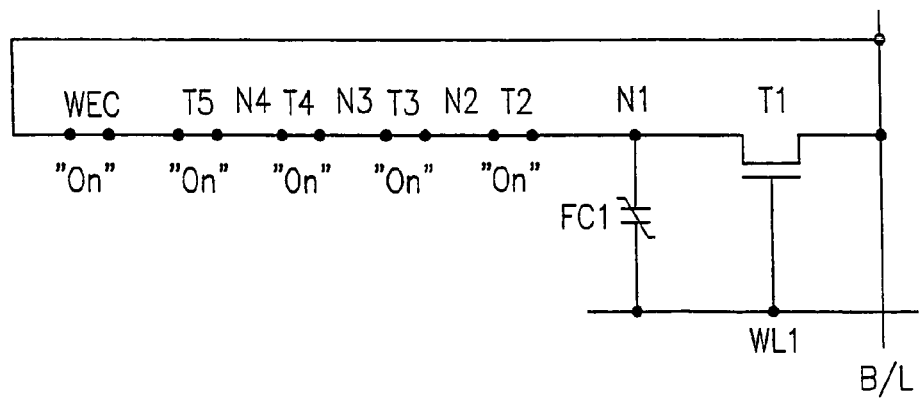

FIGS. 13A and 13B explain basical read/write operation mechanisms for processing a logic "1" on a ferroelectric capacitor of the present invention, respectively.

Referring to FIG. 13A, upon enabling only the first wordline WL1 at first in a read mode, the first NMOS transistor T1 is enabled to be turned on while rest of the transistors T2, T3, T4 and T5 are disabled to be turned off. Accordingly, the data in the ferroelectric capacitor FC1 induced to the wordline WL1 is provided to the bitline B/L through the node N1 and the NMOS transistor T1, so that the sense amplifier (not shown) connected to the bitline B/L amplifies and stores the data in the register 111, temporarily. As shown in FIG. 13B, in a write mode or a re-store mode, only the first wordline WL1 is disabled at first in a reverse order to the read mode, to transit the NMOS transistor T1 from an enabled state to a disabled state. Thus, in the write mode, both an enabled and a disabled periods of the wordline are used. A logic "0" may be written in the enabled period, and a logic "1" may be written in the disabled period. That is, because, though the transistor T1 is in a turned off state as the wordline WL1 is disabled to a low level in the disabled period, rest T2, T3, T4 and T5 of the transistors are in enabled states, a high data on the bitline B/L is provided to the node N1, and because a low data is provided to the wordline WL1 side electrode of the ferroelectric capacitor FC1, a logic "0" can be written on the ferroelectric capacitor FC1.

Figure 14A:
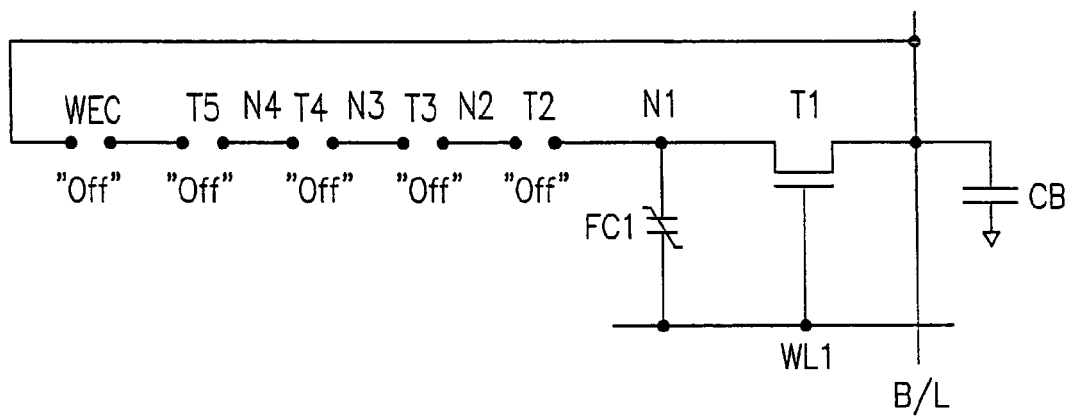
FIGS. 14A and 14B explain basical read/write operation mechanisms for processing a logic "0" on a ferroelectric capacitor of the present invention, respectively.
Figure 14B:
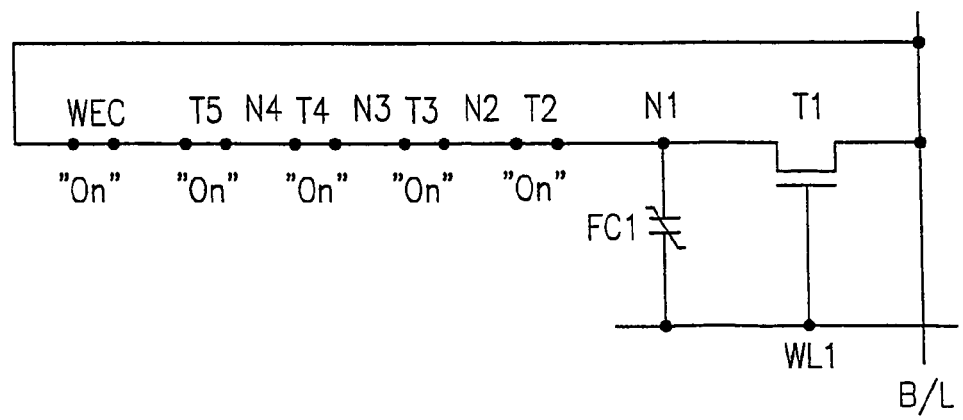

FIGS. 14A and 14B explain basical read/write operation mechanisms for processing a logic "0" on a ferroelectric capacitor of the present invention, respectively.

Referring to FIG. 14A, upon enabling only the first wordline WL1 in a read mode, the NMOS transistor T1 is enabled to be turned on while rest of the transistors T2, T3, T4 and T5 are disabled to be turned off. Accordingly, the data in the ferroelectric capacitor FC1 induced by the wordline WL1 is provided to the bitline B/L through the node N1 and the NMOS transistor T1, so that the sense amplifier (not shown) amplifies and stores the data in the register 111, temporarily. In the meantime, as shown in FIG. 14B, in a write or re-store mode, only the first wordline WL1 is disabled at first in a reverse order to the read mode, to transit the NMOS transistor T1 from an enabled state to a disabled state. Thus, in the write mode, both an enabled and a disabled periods of the wordline are used, wherein a logic "0" may be written in the enabled period, and a logic "1" may be written in the disabled period. That is, because the wordline is at high in the enabled period, to provide a high data to a wordline side electrode of the ferroelectric capacitor, a logic "0" can be written on the ferroelectric capacitor FC1.

Up to now, NAND type nonvolatile ferroelectric memory cells are explained, and nonvolatile ferroelectric memories of the foregoing cells will be explained, hereafter.

Figure 15A:
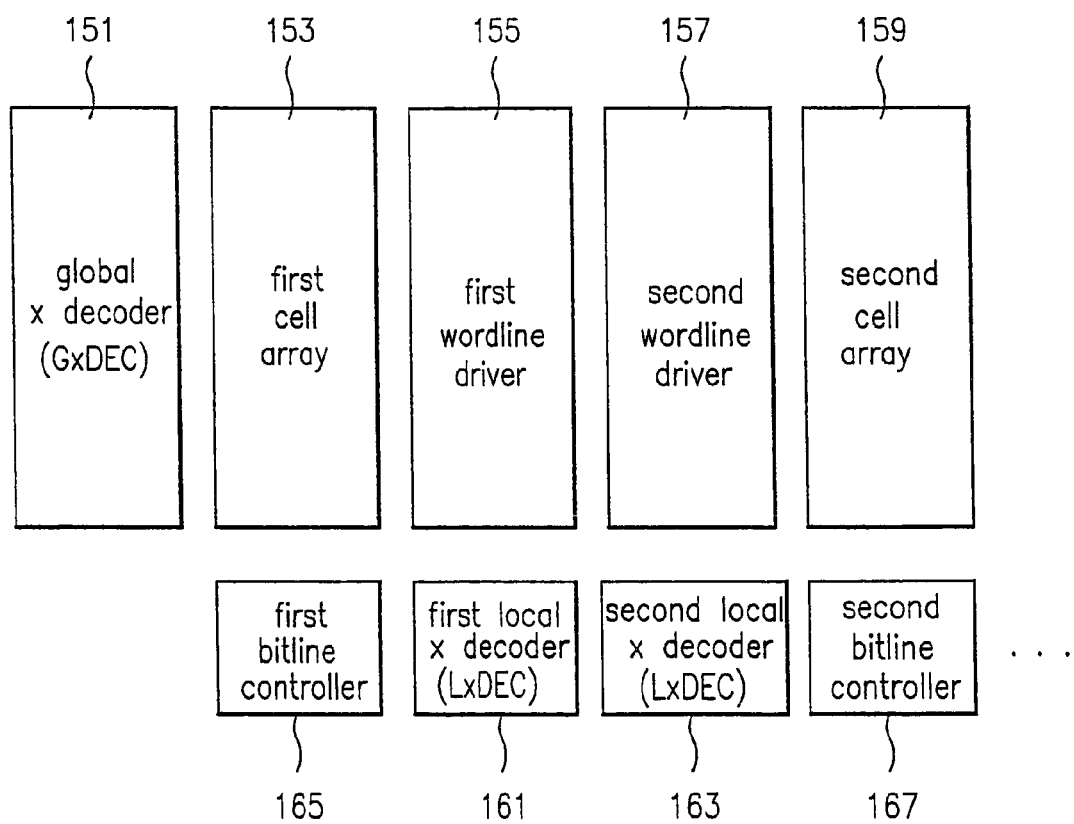
FIG. 15A illustrates a system of a nonvolatile ferroelectric memory in accordance with a first preferred embodiment of the present invention.

FIG. 15A illustrates a system of a nonvolatile ferroelectric memory in accordance with a first preferred embodiment of the present invention.

Figure 15B:
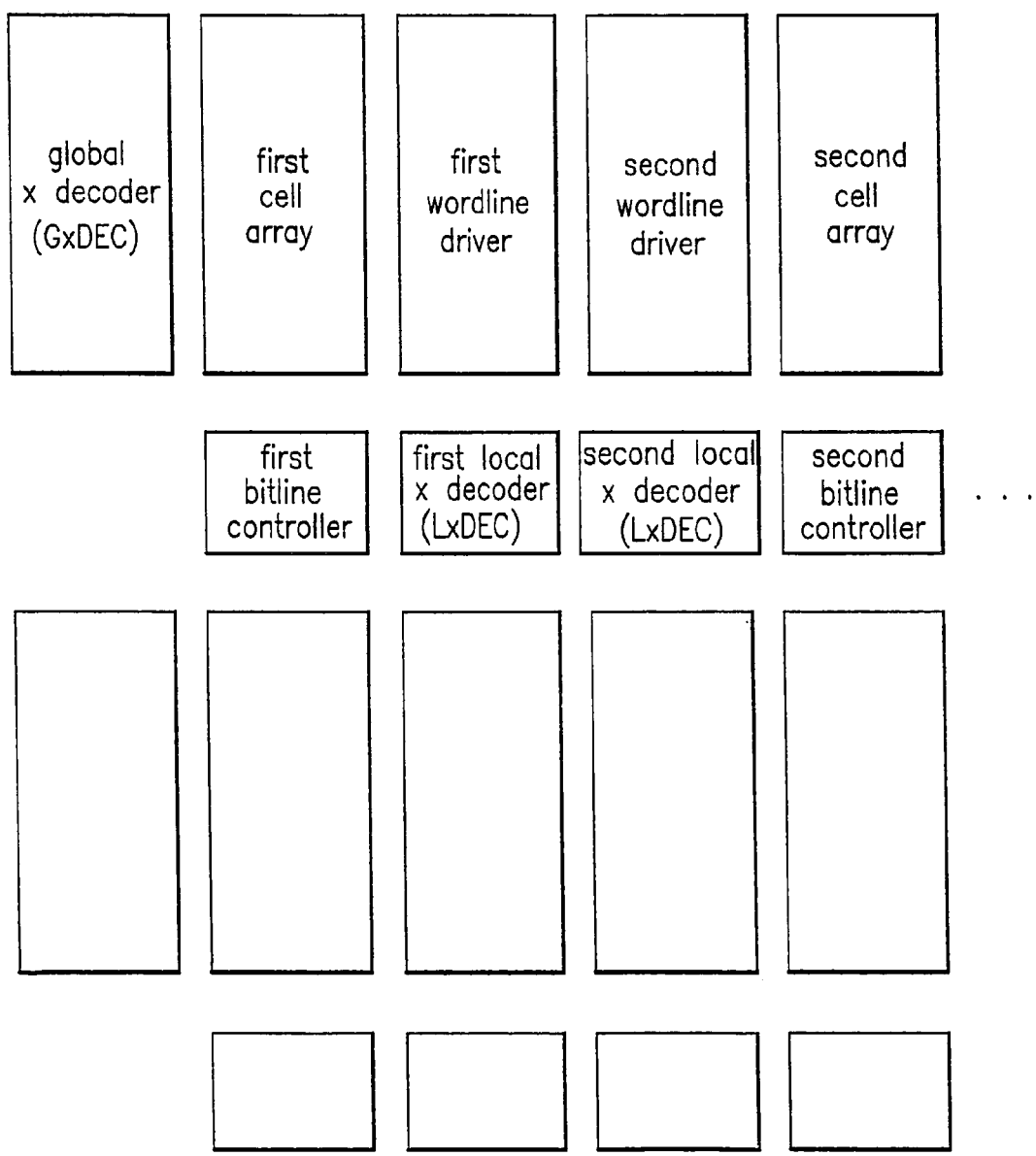
FIG. 15B illustrates a system of a nonvolatile ferroelectric memory when the system in FIG. 15A is provided repeatedly.

Referring to FIG. 15A, the nonvolatile ferroelectric memory in accordance with a first preferred embodiment of the present invention includes a global X decoder 151, a first cell array 153 at one side of the global X decoder 151, a first wordline driver 155 formed on one side of the first cell array 153, a second wordline driver 157 formed on one side of the first wordline driver 155, a second cell array 159 at one side of the second wordline driver 157, a first local X decoder 161 under the first wordline driver 155, a second local X decoder 163 under the second wordline driver 157, and a first and a second bitline controllers 165 and 167 under the first cell array 153 and the second cell array 159, respectively. Each of the first and second cell arrays 153 and 159 includes a main cell array and a reference cell array each having a plurality of unit cells. The unit cell, being the aforementioned NAND type nonvolatile ferroelectric memory cell, may be a 4-NAND type, or a multi-NAND type nonvolatile ferroelectric memory cell. The global X decoder 151 controls a plurality of global wordlines GWL. Each of the first and second local X decoders 161 and 163 provides enable signals LXDEC1~LXDECC$_N$ for enabling the wordlines of the NAND type nonvolatile ferroelectric memory cell in succession and a WEC signal. Each of the first and second wordline drivers 155 and 157 has a plurality of sub-drivers each connected to the global wordline. A system as shown in FIG. 15B may be obtained when a system as shown in FIG. 15A is provided, repeatedly.

Figure 16:
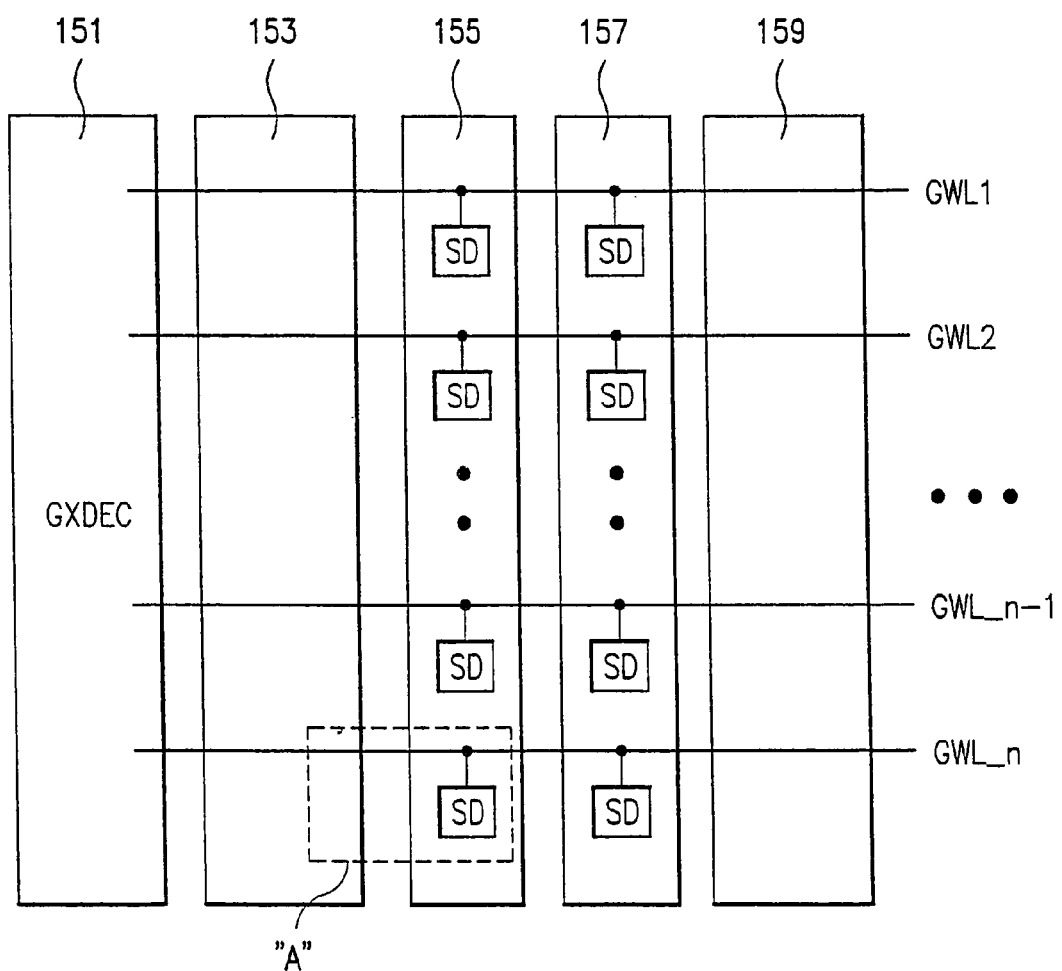
FIG. 16 illustrates a part of a system of a nonvolatile ferroelectric memory in accordance with a first preferred embodiment of the present invention shown in detail.

The nonvolatile ferro electric memory in accordance with a first preferred embodiment of the present invention will be explained in more detail. FIG. 16 illustrates a part of a system of a nonvolatile ferroelectric memory in accordance with a first preferred embodiment of the present invention shown in detail centered on the wordline driver.

Referring to FIG. 16, there are the first wordline driver 155 and the second wordline driver 157 disposed in parallel, and the first cell array 153 and the second cell array 159 disposed on opposite sides of the first and second wordline drivers 155 and 157, for a more effective layout. As shown in the drawing, the first and second wordline drivers 155 and 157 have a plurality of sub-drivers SD. As shown in FIG. 16, the global X decoder 151 includes a plurality of global wordlines GWL1, GWL2, - - - , GWL__n connected thereto each having the sub-drivers SD connected thereto. And, as shown in the drawing, each of the first and second wordline drivers 155 and 157 has the sub-drivers as many as the global wordlines. And, each of the global wordlines GWL1~GWL$_N$ has the sub-driver of the first wordline driver 155 and the sub-driver of the second wordline driver 157 connected thereto in common.

Figure 17:
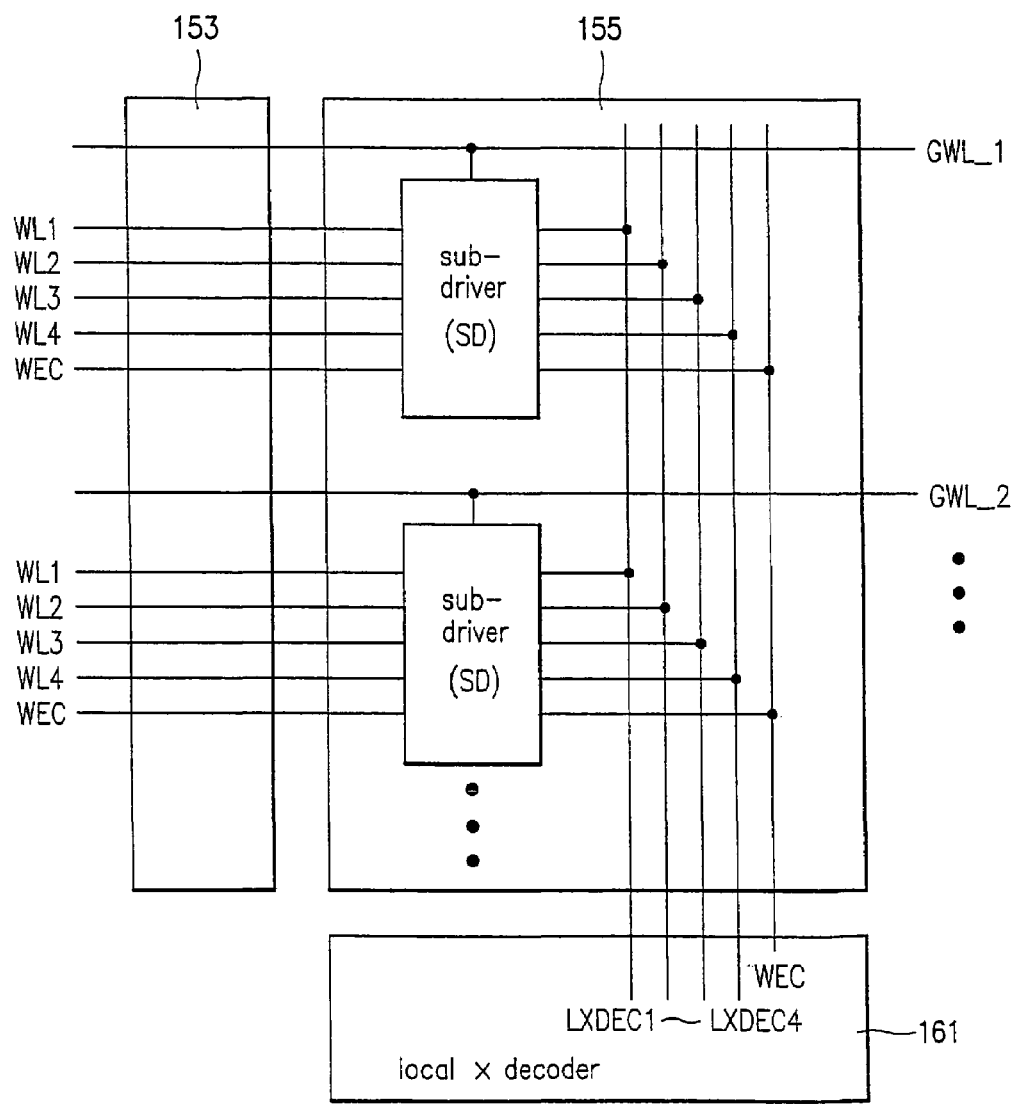
FIG. 17 illustrates a part of a system of a nonvolatile ferroelectric memory in accordance with a first preferred embodiment of the present invention shown in detail.

FIG. 17 illustrates a part of a system of a nonvolatile ferroelectric memory in accordance with a first preferred embodiment of the present invention shown in detail on relations of the signals LXDEC1, LXDEC2, LXDEC3 LXDEC4 and WEC from the local X decoder to the sub-drivers.

Referring to FIG. 17, the sub-driver is operative in response to a signal from the global wordline GWL provided from the global X decoder (not shown) for providing signals from the local X decoder 161 to the wordlines WL1~WL4 in succession. The WEC signal is enabled only in a write or re-store mode.

Figure 18:
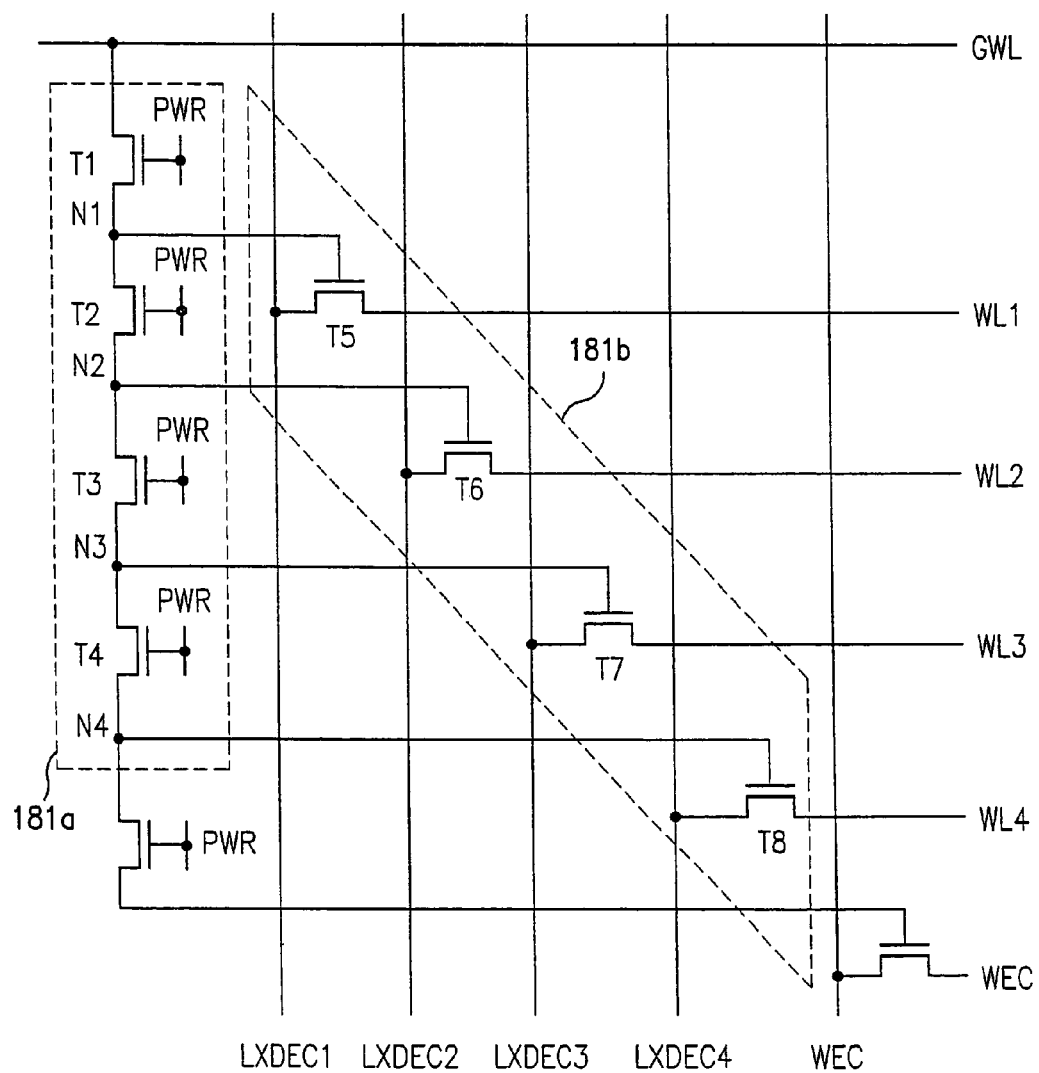
FIG. 18 illustrates a detailed system of a sub-driver shown in FIG. 17.

FIG. 18 illustrates a detailed system of a sub-driver shown in FIG. 17.

Referring to FIG. 18, the sub-driver includes a first controller 181a having four NMOS transistors T1, T2, T3 and T4 connected to the global wordline GWL connected to the global X decoder (not shown) in series, and a second controller 181b having NMOS transistors T5, T6, T7 and T8 for providing signals LXDEC1, LXDEC2, LXDEC3 and LXDEC4 from the local X decoder (not shown) to the wordlines WL1~WL4 in succession controlled by drain voltages of the transistors in succession. The local X decoder provides the WEC signal, together with LXDEC1~LXDEC4 signals. The sub-driver turns on the NMOS transistors T5, T6, T7 and T8 in the second controller 181b in succession as the NMOS transistors T1~T4 in the first controller 181a are turned on in succession. According to this, the signals LXDEC1, LXDEC2, LXDEC3 and LXDEC4 from the local X decoder are provided to the wordlines WL1, WL2, WL3 and WL4 in succession, and the WEC signal is provided thereto, finally. FIG. 18 illustrates a case when the unit cell is 4-NAND type, and if the unit cell is an n-NAND type, the local X decoder provides LXDEC1~LXDEC$_N$ signals, together with the WEC signal. And, there are n-NMOS transistors in the first controller 181a and the second controller 181b. In the sub-driver, when the global wordline GWL is enabled, the first transistor T1 in the first controller 181a is turned on, to turn on the first transistor T5 in the second controller 181b. According to this, the LXDEC1 signal from the local X decoder is provided to the first wordline WL1, to enable the first wordline WL1. In this instance, rest of the transistors are in disabled states, being held in turned off states. Therefore, as the first wordline WL1 is enabled, the first transistor T1 in the 4-NAND cell is turned on, to provide a data stored in the ferroelectric capacitor FC1 to the bitline through the NMOS transistor T1. Thus, data stored in the ferroelectric capacitors FC are read and stored in the register, a temporary storage, in succession. Since the process for reading data in the NAND cell is explained already as well as the write process, the explanation on the processes will be omitted.

Figure 19:
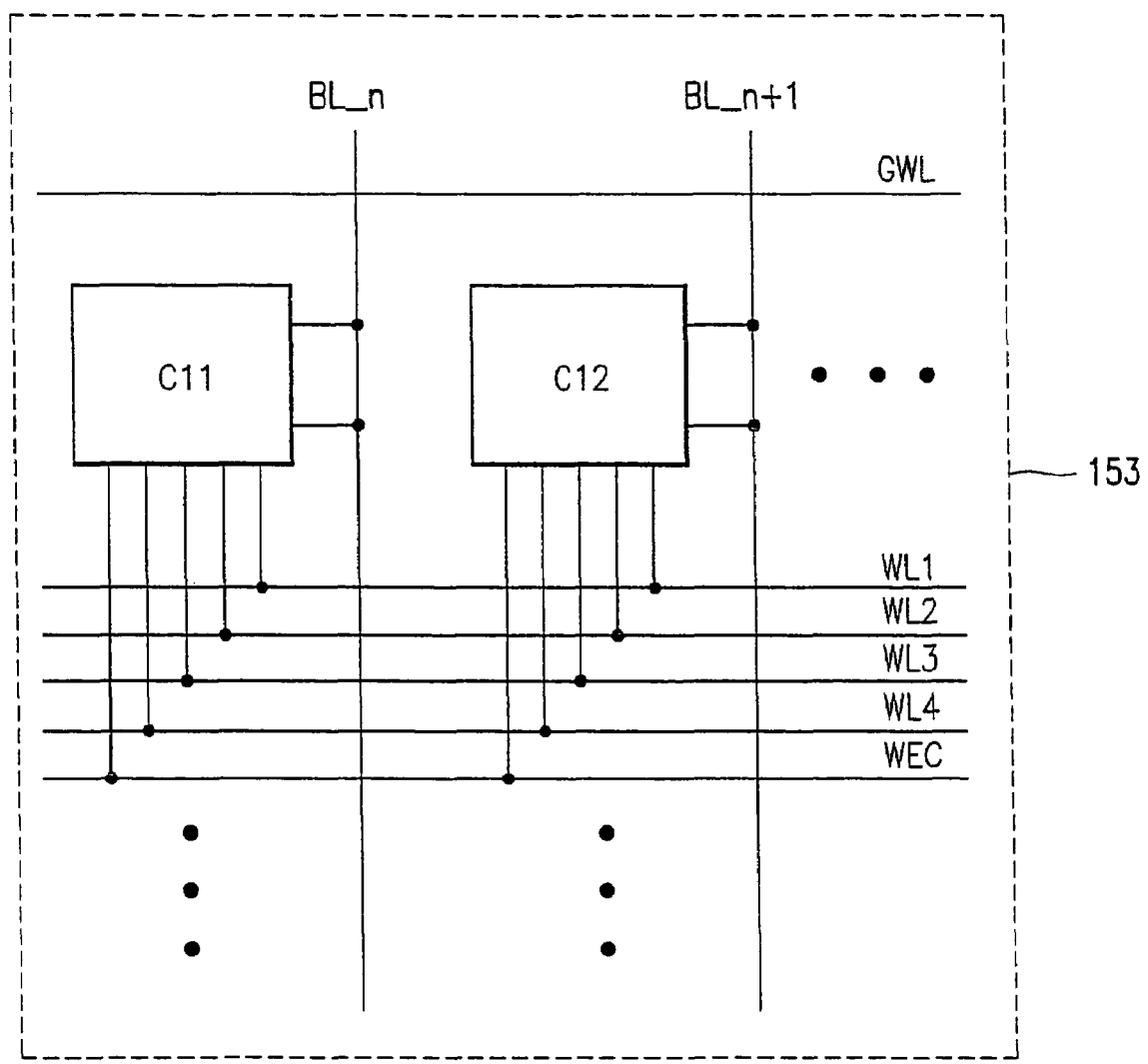
FIG. 19 illustrates a part of a system of a nonvolatile ferroelectric memory in accordance with a first preferred embodiment of the present invention shown in detail.

FIG. 19 illustrates a part of a system of a nonvolatile ferroelectric memory in accordance with a first preferred embodiment of the present invention shown in detail with regard to relations between the unit cell, the bitlines and the wordlines.

Referring to FIG. 19, there are a plurality of bitlines - - - , BL__n, BL__n+1, - - - in a column direction, each having unit cells - - - , C11, C12, - - - connected thereto. As explained, the unit cell may be a 4-NAND cell (FIG. 7a) or a multi-NAND cell (FIG. 9), wherein, of the five transistors T1, T2, T3, T4 and T5 connected in series, a source of the first transistor T1 and a drain of the fifth transistor T5 are connected to the bitline, if it is the case of 4-NAND cell. In a case of the multi-NAND cell, drains of the first transistor T1 and the last transistor T$_N$ are connected to the bitline.

Figure 20:
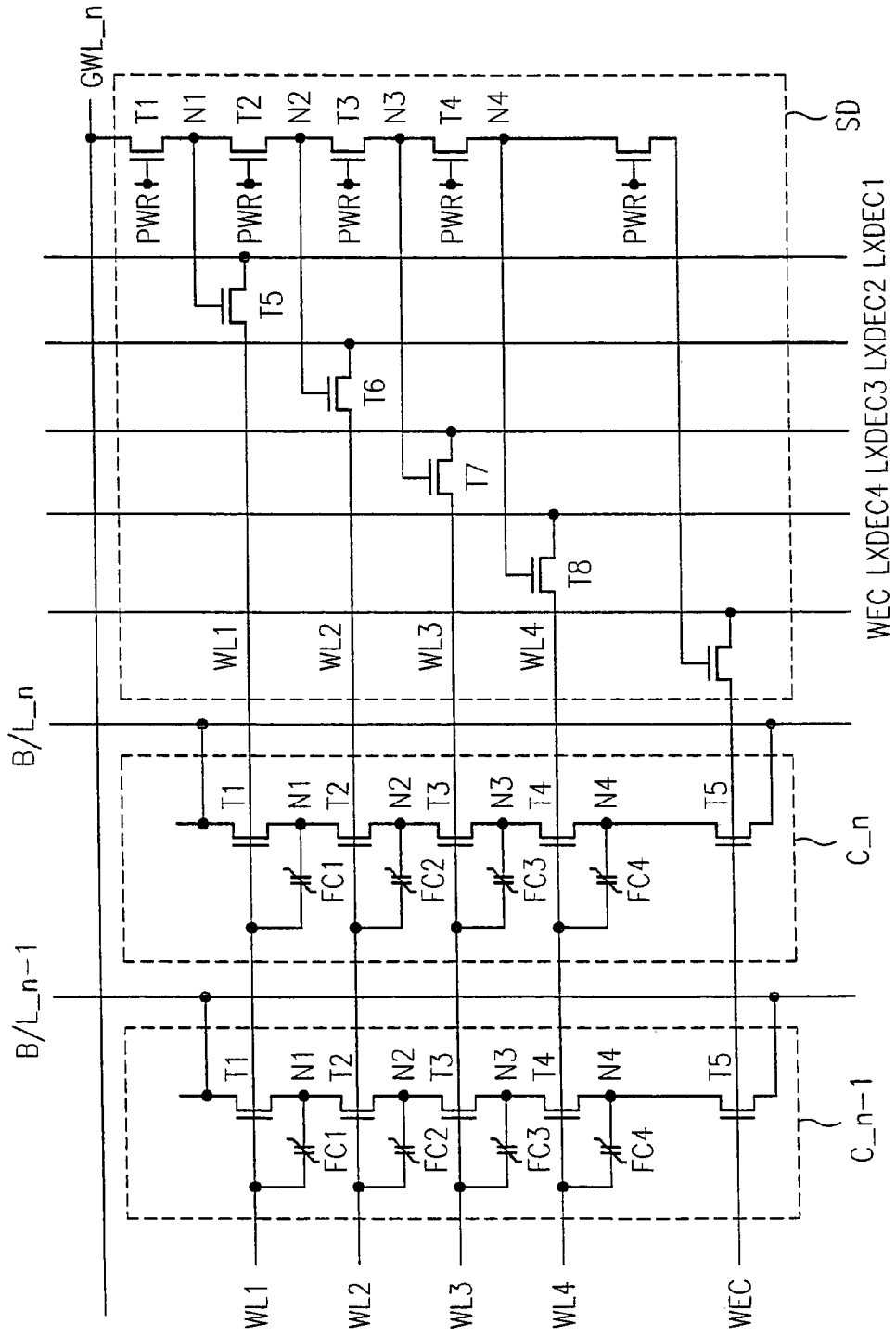
FIG. 20 illustrates a detail of "A" part in FIG. 16.

FIG. 20 illustrates a part of a system of a nonvolatile ferroelectric memory in accordance with a first preferred embodiment of the present invention shown in detail with regard to relations between the sub-driver and the cell array, which is a detail of "A" part in FIG. 16.

FIG. 20 illustrates a case when the unit cell is an NAND cell, wherein a global wordline GWL__n is formed in a row direction, and a plurality of bitlines - - - , B/L__n-1, B/L__n are formed in a direction crossing the global wordline. And, the NAND cells - - - , MC__n-1, MC__n are connected to respective bitlines, and the sub-driver SD is connected to the global wordline GWL__n. As shown in the drawing, the WEC signal, which is held disabled in the read mode and transits into an enabled state upon starting the write mode, is provided from the local X decoder, together with the LXDEC1~LXDEC4 signals.

Figure 21:
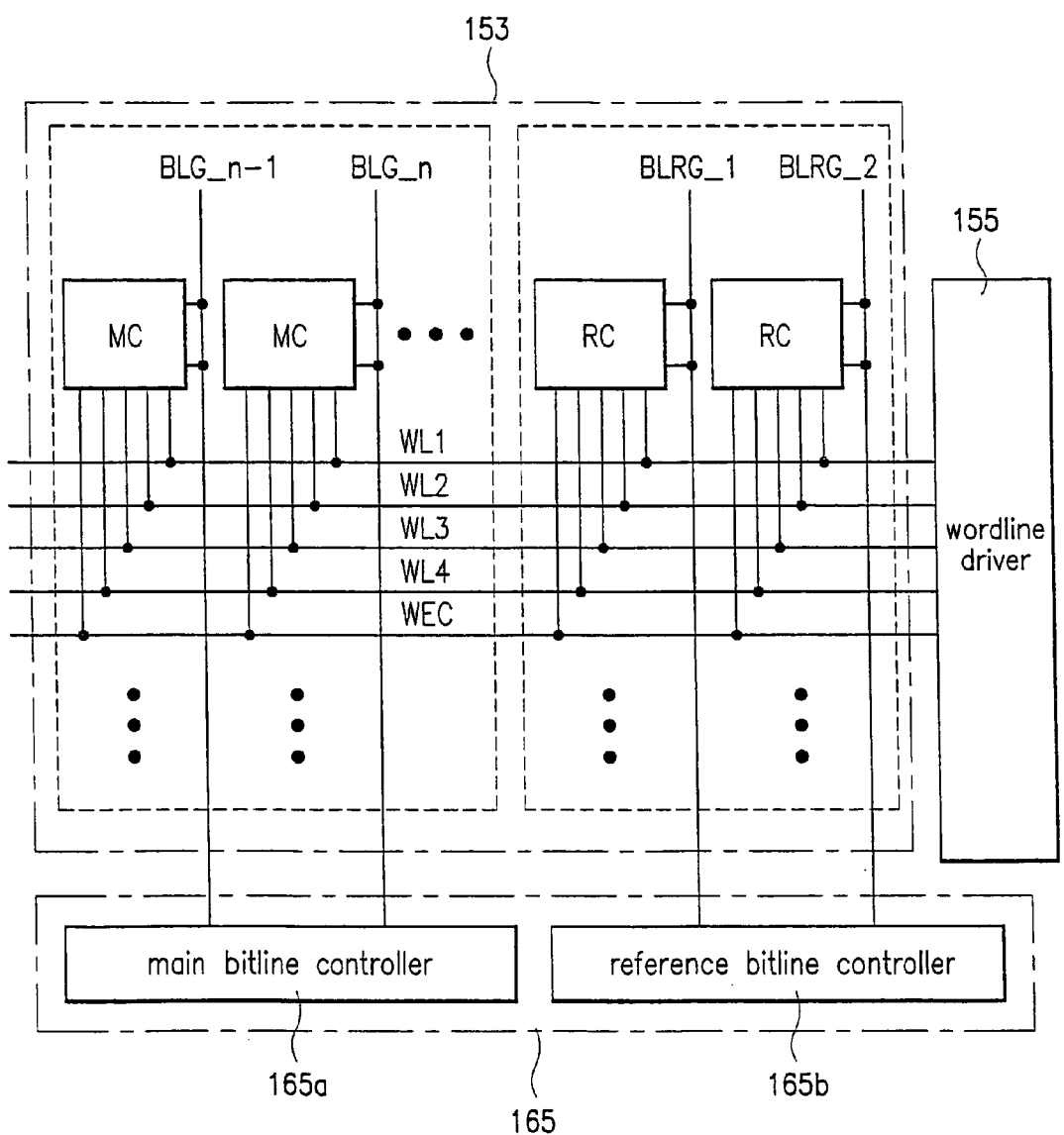
FIG. 21 illustrates a part of a system of a nonvolatile ferroelectric memory in accordance with a first preferred embodiment of the present invention shown in detail.

FIG. 21 illustrates a part of a system of a nonvolatile ferroelectric memory in accordance with a first preferred embodiment of the present invention shown in detail centered on the first bitline controller and the first cell array in FIG. 15A.

The first bitline controller 165 may use a sense amplifier in the bitline controller, or may be provided with a register separately, for temporary storage of a data read from the cells. As shown in the drawing, the first bitline controller 165 includes a main bitline controller 165a and a reference bitline controller 165b. The cell array 153 has a plurality of global bitlines, and each of the global bitlines in turn has a plurality of main global bitlines - - - , BLG__n-1 and BLG__n, and one pair of reference global bitlines BLRG__1 and BLRG__2. The main global bitlines - - - , BLG__n-1 and BLG__n are connected to the main bitline controller 165a, and the reference global bitlines BLRG__1 and BLRG__2 are connected to the reference bitline controller 165b. Every main global bitline has the NAND type nonvolatile memory cell MC of the present invention connected thereto, and the reference global bitline BLRG has the NAND type nonvolatile memory cell RC connected thereto, too. The unexplained numeral "155" is a wordline driver having the sub-drivers for providing the LXDEC1, LXDEC2, LXDEC3, LXDEC4 signals from the local X decoder (not shown) to the wordlines WL1, WL2, WL3, WL4 in succession. Connections between the bitline and the NAND type memory cell is explained already. The memory cells MC and RC connected to the main global bitline and the reference global bitline may be the 4-NAND or the multi-NAND, and the reference bitline controller 165b takes two reference global bitlines BLRG__1 and BLRG__2.

Figure 22:
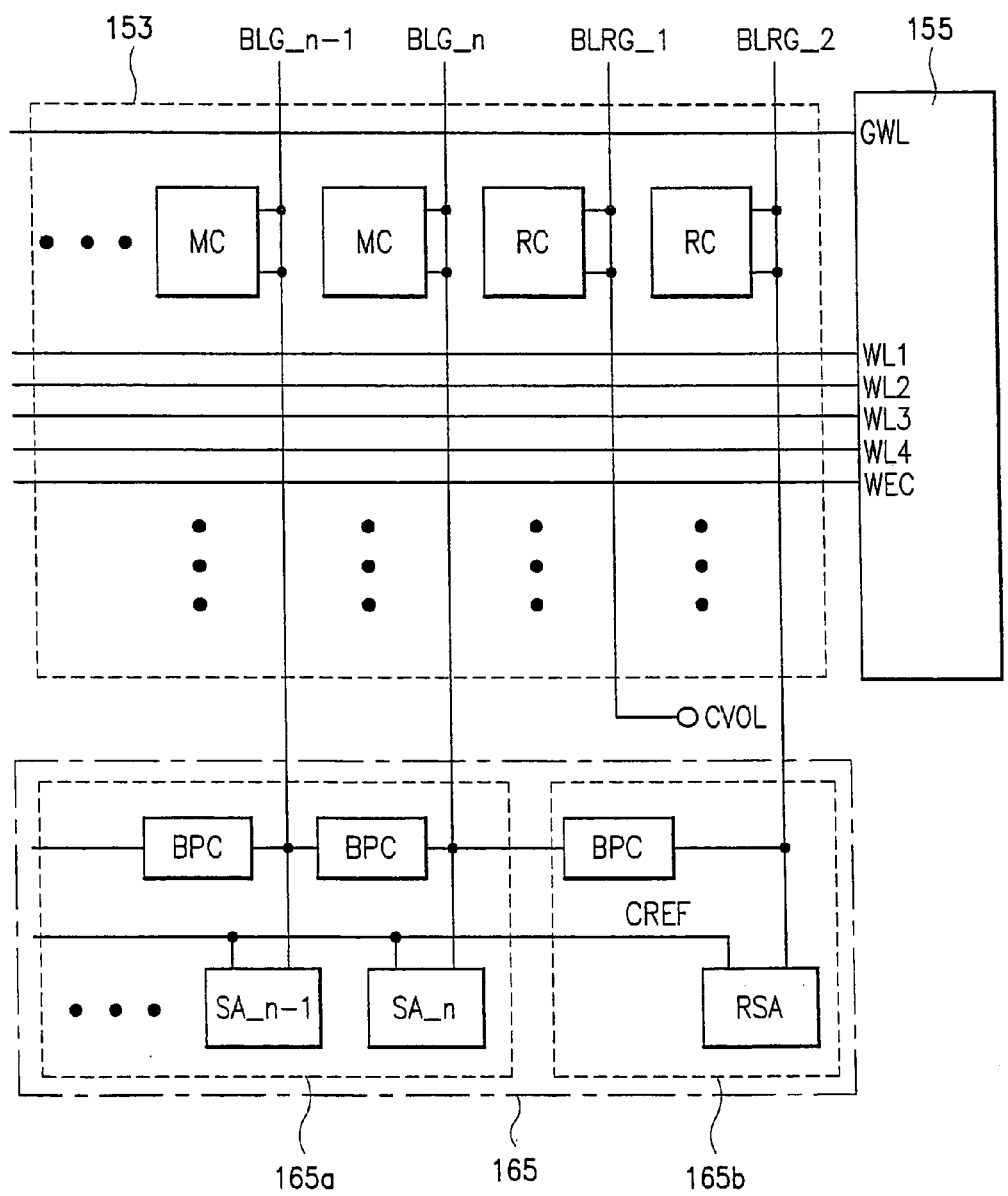
FIG. 22 illustrates a detail of FIG. 21 shown centered on the bitline controller.

FIG. 22 illustrates a detail of FIG. 21 shown centered on the bitline controller.

Main sense amplifiers - - - , SA__n-1, SA__n are connected to respective main global bitlines - - - , BLG__n-1, BLG__n. One of the two reference global bitlines BLRG__1, BLRG__2 is connected to the reference sense amplifier RSA, and a reference voltage CREF from the reference sense amplifier RSA is provided to the main sense amplifiers - - - , SA__n-1, SA__n in common. There is a BPC (Bitline Precharge Circuit) between adjacent main global bitlines BLG__n-1, BLF__n. And, the BPC is also provided between the last main global bitline BLG-n and the reference global bitline BLRG__2 connected to the reference sense amplifier RSA. The one reference global bitline BLRG__1 which is not connected to the reference sense amplifier RSA has a CVOL (Constant Voltage) applied thereto. Though it will be explained later in detail, the BPC precharges adjacent global bitlines to a preset level.

Up to now, nonvolatile ferroelectric memories of NAND type nonvolatile ferroelectric memory cells in accordance with a first preferred embodiment of the present invention are explained.

Figure 23:
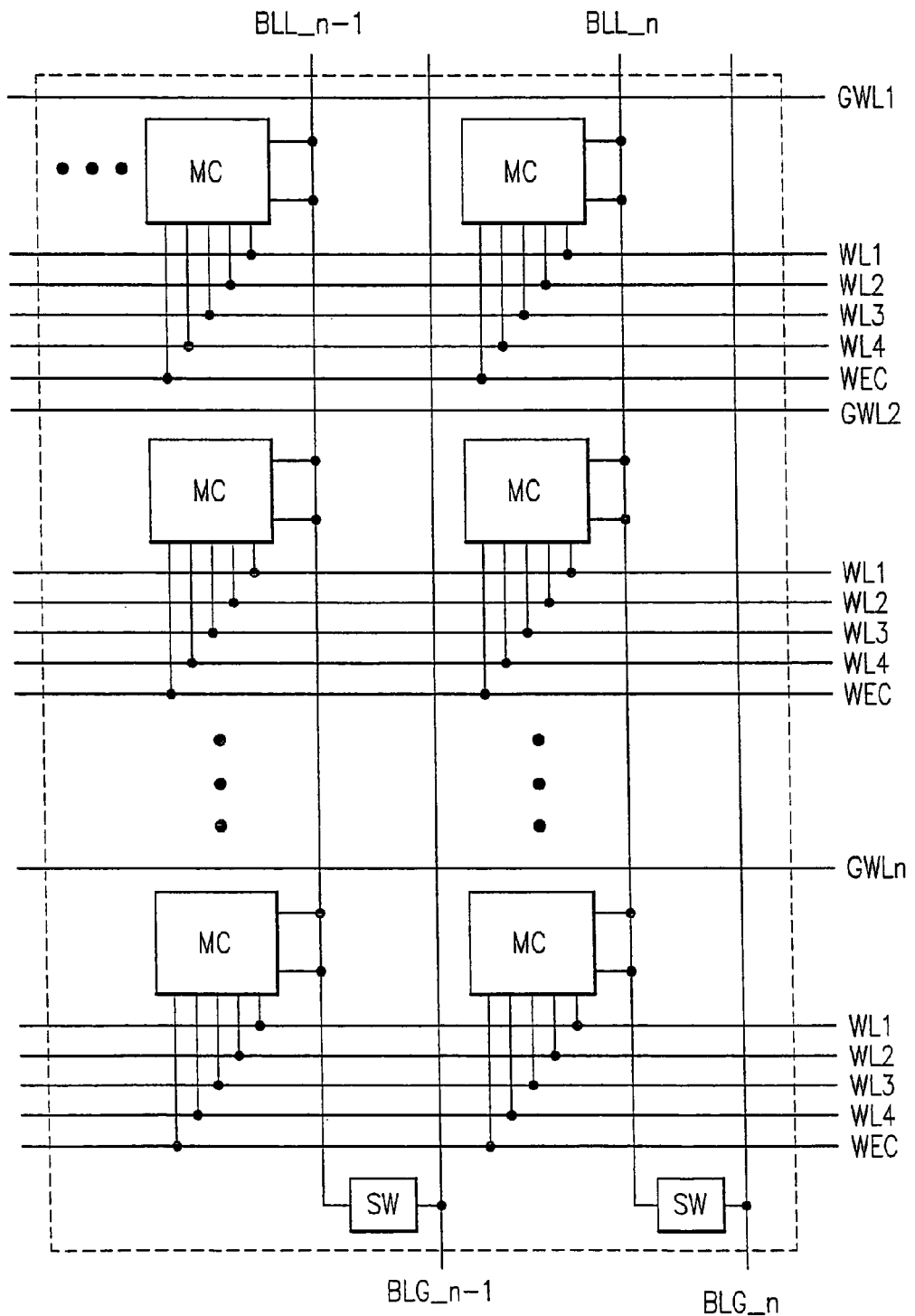
FIG. 23 illustrates a system of a cell array for explaining a nonvolatile ferroelectric memory in accordance with a second preferred embodiment of the present invention.

FIG. 23 illustrates a system of a cell array for explaining a nonvolatile ferroelectric memory in accordance with a second preferred embodiment of the present invention. Though the cell array includes a plurality of sub-cell arrays, FIG. 23 illustrates only one sub-cell array. Therefore, the cell array includes the sub-cell array illustrated in FIG. 23, repeatedly. In comparison to the first embodiment of the present invention in which a plurality of NAND type unit cells are connected to the global bitline directly, the second embodiment of the present invention is provided with switching devices for selectively connecting only one of the plurality of NAND type unit cells to the global bitline. To do this, the second embodiment of the present invention introduces local bitlines BLL together with the global bitline BLG. That is, the local bitline in the second embodiment of the present invention corresponds to the global bitline in the first embodiment of the present invention.

Referring to FIG. 23, the cell array in accordance with a second preferred embodiment of the present invention includes global bitlines - - - , BLG_n-1, BLG_n formed at fixed intervals, local bitlines - - - , BLL_n-1, BLL_n formed in correspondence to respective global bitlines in a direction identical to the global bitlines, a plurality of NAND type unit cells MC connected to each of the local bitlines, a switching device SW connected to an end of the local bitline - - - , BLL_n-1, BLL_n and a corresponding global bitline - - - , BLG_n-1, BLG_n. In a read mode, one of the plurality of cells MC connected to the local bitline is selected, for providing the data in the selected cell to the global bitline through the switching device SW. The data provided to the global bitline is sensed and amplified by the sense amplifier in the bitline controller.

Figure 24:
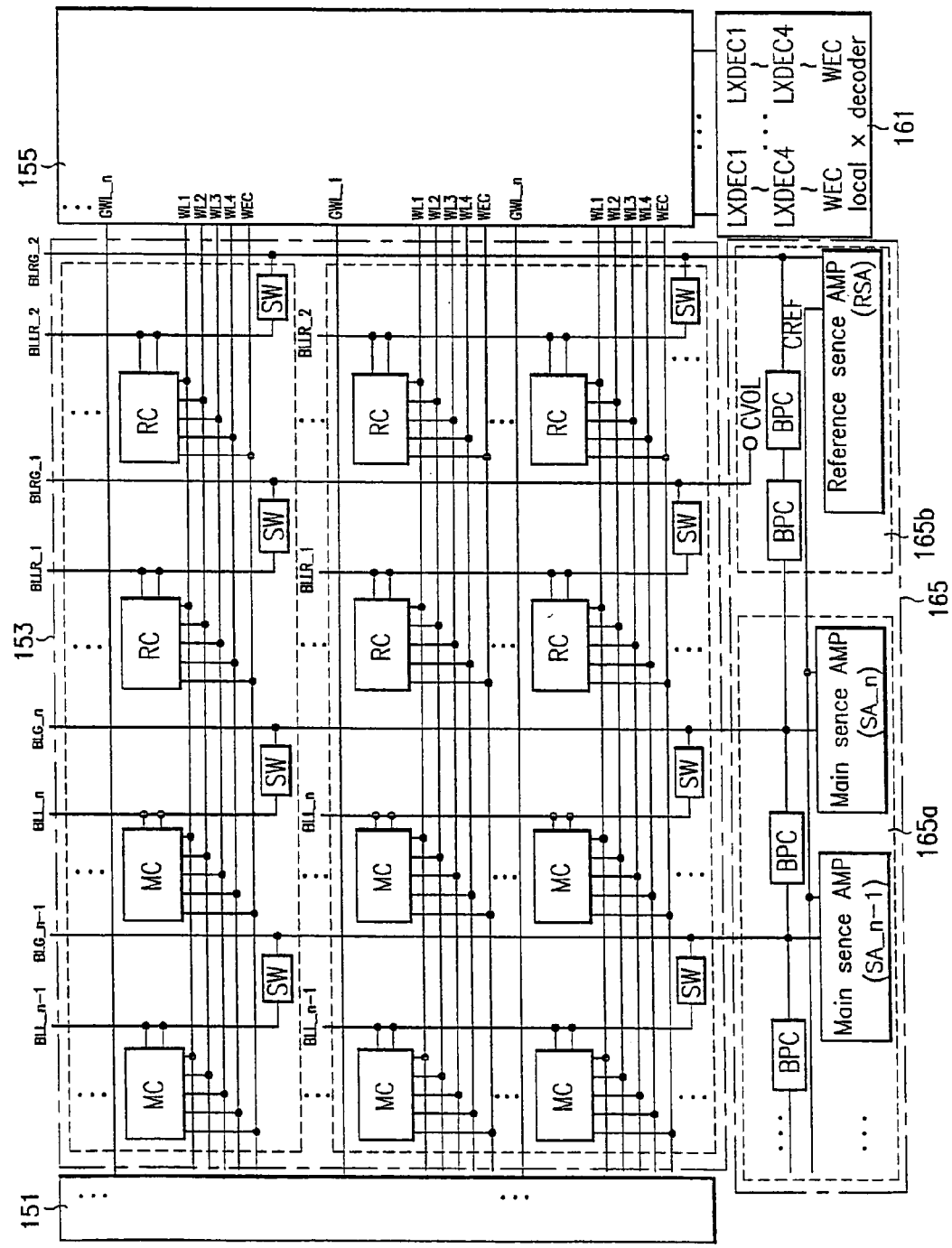
FIG. 24 illustrates a nonvolatile ferroelectric memory in accordance with a second preferred embodiment of the present invention.

FIG. 24 illustrates a system of an NAND type nonvolatile ferroelectric memory in accordance with a second preferred embodiment of the present invention. As can be known from the drawing, the second embodiment cell array is different from the first embodiment cell array of the NAND type nonvolatile ferroelectric memory of the present invention.

Referring to FIG. 24, the NAND type nonvolatile ferroelectric memory in accordance with a second preferred embodiment of the present invention includes a global X decoder (not shown), a cell array 153, a bitline controller 165 under the cell array 153, a wordline driver 155 on one side of the cell array 153, and a local X decoder 161 under the wordline driver 155.

The aforementioned NAND type nonvolatile ferroelectric memory in accordance with a second preferred embodiment of the present invention will be explained in more detail.

That is, the NAND type nonvolatile ferroelectric memory in accordance with a second preferred embodiment of the present invention includes a plurality of main global bitlines - - - , BLG_n-1, BLG_n and reference global bitlines BLRG_1, BLRG_2, both of which are connected to the bitline controller 165. The bitline controller 165 in turn includes a main bitline controller 165a and a reference bitline controller 165b. The main bitline controller 165a is provided with sense amplifiers - - - , SA_n-1, SA_n in correspondence to respective main global bitlines, and BPCs for precharge of an adjacent bitlines. The reference bitline controller 165b has a reference sense amplifier RSA connected to the reference global bitline BLRG_2 of the two reference global bitlines. The wordline driver 155 provides signals LXDEC1~LXDEC4 from the local X decoder 161 to the wordlines WL1, WL2, WL3, WL4 in response to a global wordline GWL signal from the global X decoder (not shown). As discussed in association with FIG. 23, the local bitlines - - - , BLL_n-1, BLL_n are provided in correspondence to respective global bitlines - - - , BLG_n-1, BLG_n. The local bitlines - - - , BLL_n-1, BLL_n have a plurality of unit cells MC connected thereto, and a switching device at an end thereof for electrical switching to a relevant global bitline. As explained, of the plurality of sub-cell arrays in the cell array, the sub-cell array can be enable, not equal to or more than two, but only one on the same time. However, the plurality of local bitlines in one enabled sub-cell array can be enabled on the same time. Therefore, the plurality of cells in a row direction can be read or written on the same time.

Figure 25:
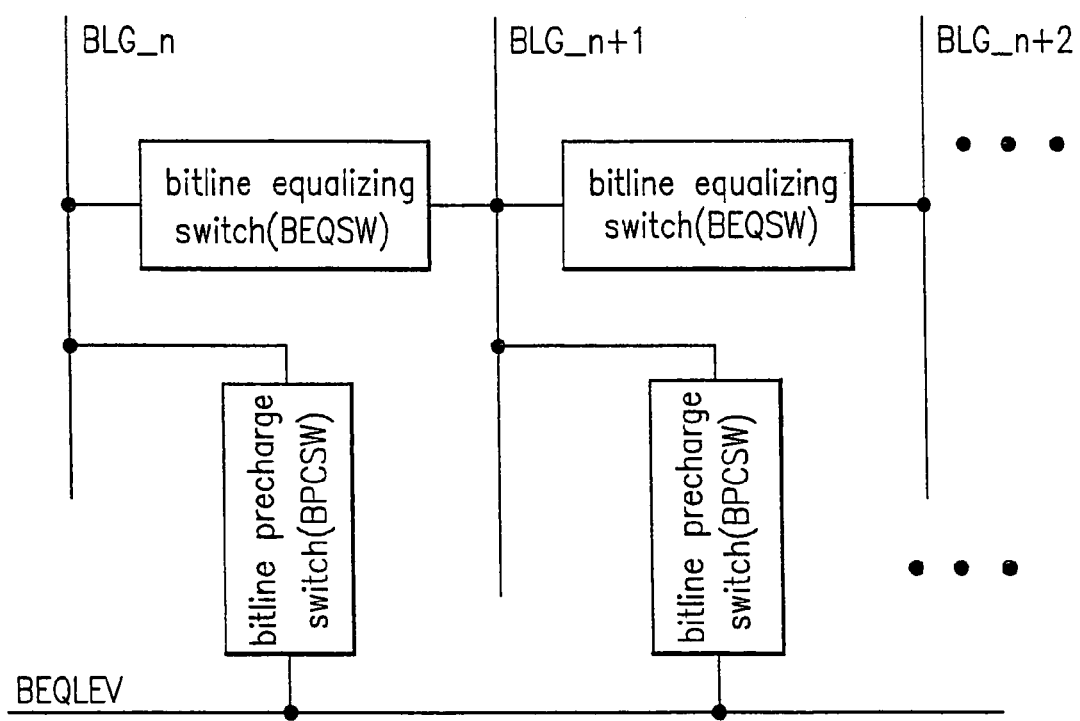
FIG. 25 illustrates a detail of a bitline precharge circuit in a nonvolatile ferroelectric memory in accordance with first and second preferred embodiment of the present invention.

In the meantime, FIG. 25 illustrates a detail of a bitline precharge circuit in a nonvolatile ferroelectric memory in accordance with first and second preferred embodiment of the present invention.

Referring to FIG. 25, the bitline precharge circuit includes a plurality of global bitlines - - - , BLG_n, BLG_n, bitline equalizing switches BEQSW each provided between global bitlines - - - , BLG_n, BLG_n, and a plurality of bitline precharge switches BPCSW for switching signal EQLEV from the bitline precharge level supplier (not shown) to respective global bitlines - - - , BLG_n, BLG_n. The bitline equalizing switches BEQSW or the bitline precharge switches BPCSW has NMOS transistors. Therefore, a level of the signal from the bitline precharge level supplier (not shown) is identical to, or slightly higher than a threshold voltage of the NMOS transistor. At the end, the signal BEQLEV from the bitline precharge level supplier precharges a level of a relevant global bitline through the bitline precharge switch BPSCW. And, the bitline equalizing switch BEQSW is turned on by a switch control signal, to equalize levels of two adjacent global bitlines the same.

Figure 26:
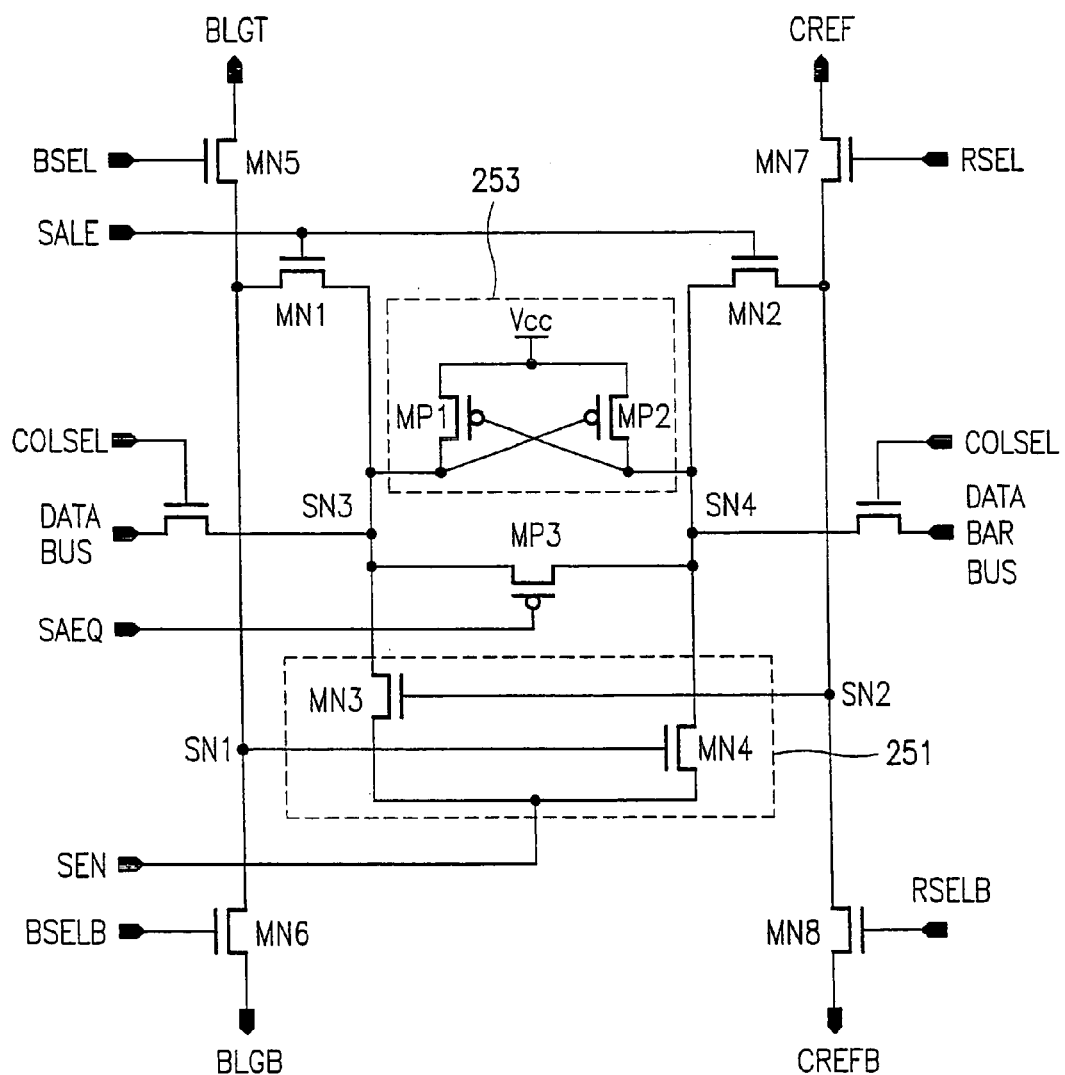
FIG. 26 illustrates a detail of a sense amplifier used in a nonvolatile ferroelectric memory in accordance with first and second preferred embodiment of the present invention in common; and, FIG. 27 explains a case when a register provided at an output terminal of a sense amplifier is used as a temporary storage of a read data.

FIG. 26 illustrates a detail of a sense amplifier used in a nonvolatile ferroelectric memory in accordance with first and second preferred embodiment of the present invention in common. The sense amplifier shown in FIG. 26 can be used as the main sense amplifier as well as the reference sense amplifier. In the system illustrated in FIG. 15B, the system illustrated in FIG. 15A are provided repeatedly, to provide the bitline controller between adjacent two cell array, so that the sense amplifier in the bitline controller can sense data both in the upper cell array and a lower cell array for effective layout. In the drawing, the BLGT is the main global bitline connected to the cell array over the BLGT, and the BLGB is the main global bitline connected to the cell array under the BLGB. And, CREF is the reference global bitline connected to the reference cell over the CREF, and the CREFB is the reference global bitline connected to the reference cell under the CREFB.

Referring to FIG. 26, the sense amplifier includes a first NMOS transistor MN1 having a source connected to the BLGT and BLGB, a second NMOS transistor MN2 having a source connected to the CREF and the CREFB, and a gate connected to a gate of the first NMOS transistor MN1 in common, a third NMOS transistor MN3 for amplifying the BLGT or BLGB signal received through the first NMOS transistor MN3, a fourth NMOS transistor MN4 for amplifying the CREF and the CREFB signals received through the second NMOS transistor MN2, a first PMOS transistor MP1 and the second PMOS transistor MP2 each having a source connected to a power source terminal Vcc and a drain connected to an output terminal of the first NMOS transistor MN1 and an output terminal of the second NMOS transistor MN2 respectively (a drain of the first PMOS transistor is connected to a gate of the second PMOS transistor and a drain of the second PMOS transistor is connected to a gate of the first PMOS transistor), and a third PMOS transistor MP3 for equalizing an output terminal of the first NMOS transistor MN1 and an output terminal of the second NMOS transistor MN2 in response to a sense amplifier equalizing signal SAEQ. There may be a fifth NMOS transistor MN5 provided between the source of the first NMOS transistor MN1 and the BLGT, and a sixth NMOS transistor MN6 between the source of the first NMOS transistor MN1 and the BLGB. And, there are a seventh NMOS transistor MN7 between the source of the second NMOS transistor MN2 and the CREF, and an eighth NMOS transistor MN8 between the source of the second NMOS transistor MN2 and the CREFB. And, there may be a ninth NMOS transistor MN9 for selective switching of a data bus and an output terminal of the sense amplifier in response to a column selection signal COLSEL, and a tenth NMOS transistor MN10 for switching the data bus and the output terminal of the sense amplifier. The fifth NMOS transistor MN5 switches between the sense amplifier and the BLGT, and the sixth NMOS transistor MN6 switches between the sense amplifier and the BLGB. And, seventh NMOS transistor MN7 switches between the sense amplifier and the CREF, and the eighth NMOS transistor MN8 switches between the sense amplifier and the CREFB.

The operation of the aforementioned sense amplifier will be explained. The following sense amplifier operation is based on sensing data stored in a cell array above the sense amplifier.

Referring to FIG. 26, provided that the fifth and seventh NMOS transistors MN5 and MN7 are enabled in response to an enable signal BSEL for enabling the fifth NMOS transistor MN5 and an enable signal RSEL for enabling the seventh NMOS transistor MN7 respectively, the sixth and eighth NMOS transistors MN6 and MN8 are disabled. Opposite to this, provided that the sixth and eighth NMOS transistors MN6 and MN8 are enabled, the fifth and seventh NMOS transistors MN5 and MN7 are disabled. The sense amplifier is disabled in an initial amplifying period in response to a column selection signal COLSEL, to cut off an external data bus from an internal node on the sense amplifier. In this instance, in order to enable the sense amplifier, a node SN3 and a node SN4 are equalized in response to the sense amplifier equalizing signal SAEQ. At an initial stage, the first NMOS transistor MN1 and the second NMOS transistor MN2 are held disabled. When the nodes SN3 and SN4 are equalized, data in the cell array is provided to the upper global bitline BLGT and to the node SN1 through the fifth NMOS transistor MN5. And, the reference voltage is provided to the CREF, and therefrom to the node SN2 through the seventh NMOS transistor MN7. After the data in the cell array and the reference voltage are respectively provided to the node SN1 and the node SN2 adequately, the reference voltage on the sense amplifier is made to transit to a ground voltage. According to this, as a voltage difference between node SN1 and node SN2 induces a voltage difference between the gate of the third NMOS transistor MN3 and the gate of the fourth NMOS transistor, the currents both to the third NMOS transistor MN3 and the fourth NMOS transistor MN4 have a difference. Under this state, the amplification started, to provide an amplified voltage, which is the voltage difference between the nodes SN3 and SN4. The voltages induced to the SN3 and SN4 are respectively amplified by the first PMOS transistor MP1 and the second PMOS transistor MP2, again. After being amplified adequately at the first PMOS transistor MP1 and the second PMOS transistor MP2, the voltages disable the fifth and seventh NMOS transistors MN5 and MN7, and enable the first and second NMOS transistors MN1 and MN2 to feed back the amplified voltages at nodes SN3 and SN4 to nodes SN1 and SN2, for sustaining the amplification. In this instance, provided a feed back loop is completed, the ninth and tenth NMOS transistors MN9 and MN10 are enabled, to facilitate data exchange between external data bus and data bar bus and the sense amplifier. And, the fifth NMOS transistor MN5 are enabled again, to provide the node SN1 voltage to the BLGT, to feed back to the cell array, to re-store the voltage therein. In the foregoing sense amplifier, a first amplifier 251 has the third NMOS transistor MN3 and the fourth NMOS transistor MN4, and the second amplifier 253 has the first PMOS transistor MP1 and the second PMOS transistor MP2. The unexplained symbol SEN denotes a sense amplifier enabling signal, being a low active signal, and the SALE signal is a signal for enabling the first and second NMOS transistors MN1 and MN2, being a high active signal.

Figure 27:
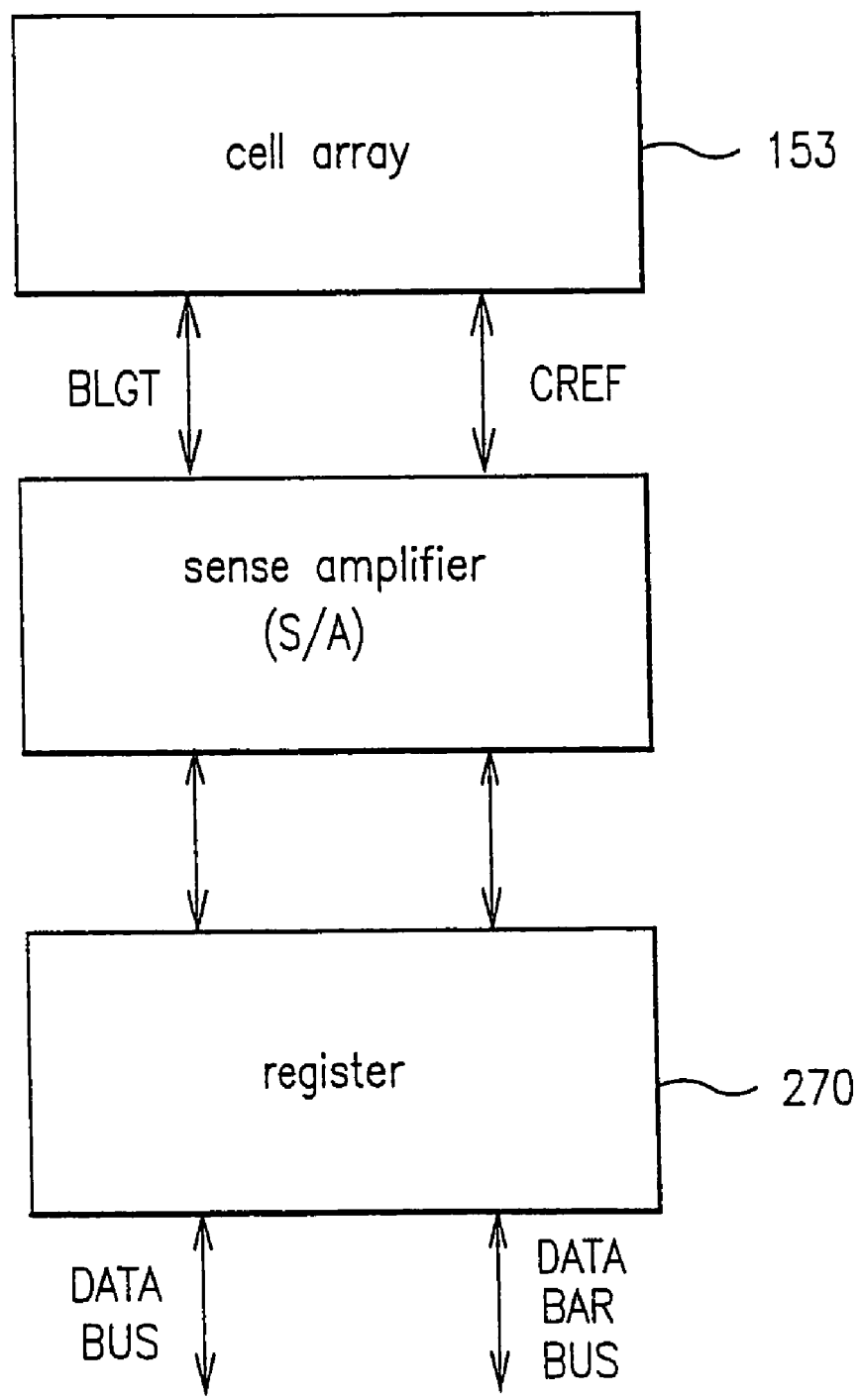

In the meantime, FIG. 27 explains a case when a register provided at an output terminal of a sense amplifier is used as a temporary storage of a read data.

Referring to FIG. 27, it is possible to provide a register 270 having an SRAM at an output terminal of the sense amplifier connected tot the data bus, for temporary storage of the data read from the NAND type nonvolatile memory cells. Therefore, the data stored in the register is stored in the nonvolatile memory cell again in a write or re-store mode. Of course, as shown in FIG. 26, the register may not be provided, but the sense amplifier may be used as a storage of the data.

The NAND type non-volatile ferroelectric memory cell and the non-volatile ferroelectric memory of the same have the following advantages.

First, because, whenever the reference cell is accessed once, the main cell is accessed once too, numbers of access times of the reference cell and the main cell are the same. Therefore, different from the related art in which the reference cell is accessed excessively in comparison to the main cell, the present invention can prolong a device lifetime as the induced voltages by the reference cell and the main cell can be maintain the same.

Second, the utilization of the capacitor lower electrode as the $N^+$ impurity regions in the substrate while bitline contacts are formed only to $N^+$ impurity regions at opposite sides of the substrate can reduce a number of bitline contacts in comparison to the related art in which the bitline contact is provided to every cell transistor, that permits to minimize a device area, to minimize a layout area, which allows a high density device packing.

It will be apparent to those skilled in the art that various modifications and variations can be made in the NAND type non-volatile ferroelectric memory cell and a non-volatile ferroelectric memory of the same of the present invention without departing from the spirit or scope of the invention. Thus, it is intended that the present invention cover the modifications and variations of this invention provided they come within the scope of the appended claims and their equivalents.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method for fabricating an NAND type non-volatile ferroelectric memory cell, comprising the steps of:
    (1) forming capacitor first electrodes in surfaces of a first conduction type semiconductor substrate at fixed intervals;
    (2) forming wordlines on the first electrodes with a ferroelectric film disposed inbetween such that the first electrodes are aligned to edge portions of the wordlines, and forming a WEC electrode on one side of a last wordline;

(3) using the wordlines and the WEC electrode as masks in implanting second conduction type impurity ions, and conducting annealing to form source and drain regions; and, (4) forming bitlines so as to be electrically connected to a first and a last regions of the source and drain regions.

2. A method as claimed in claim 1, wherein the capacitor first electrodes are formed by impurity ion implanting.

3. A method as claimed in claim 2, wherein the step (1) includes the steps of;

(14-1) coating photoresist on the first conduction type semiconductor substrate;

(14-2) patterning the photoresist to expose the substrate at fixed intervals;

(14-3) using the patterned photoresist in implanting impurity ions, and conducting annealing, to form first electrodes in surfaces of the substrate at fixed intervals.

4. A method as claimed in claim 1, wherein the step (2) includes the steps of;

forming a ferroelectric film on the substrate having the first electrodes formed thereon, forming a wordline material layer on the ferroelectric film, patterning the wordline material layer such that the first electrodes are aligned to edge portions thereof, to form the wordlines and the WEC electrode.

5. A method as claimed in claim 3, further including the step of forming a diffusion barrier for preventing diffusion of the ferroelectric film into the substrate before formation of the ferroelectric film.

6. A method as claimed in claim 3, further including the step of forming a diffusion barrier for preventing diffusion of the ferroelectric film into the wordline material layer after formation of the ferroelectric film.

* * * * *